(12) United States Patent
Kim

(10) Patent No.: US 11,844,206 B2
(45) Date of Patent: Dec. 12, 2023

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/404,462

(22) Filed: Aug. 17, 2021

(65) Prior Publication Data

US 2022/0278106 A1    Sep. 1, 2022

(30) Foreign Application Priority Data

Feb. 26, 2021    (KR) .......................... 10-2021-0026739

(51) Int. Cl.
*H10B 12/00* (2023.01)
*H01L 29/06* (2006.01)

(52) U.S. Cl.
CPC ......... *H10B 12/30* (2023.02); *H01L 29/0649* (2013.01); *H10B 12/03* (2023.02); *H10B 12/482* (2023.02); *H10B 12/488* (2023.02)

(58) Field of Classification Search
CPC ..... H01L 21/823437; H01L 21/823481; H01L 28/86; H01L 29/0649; H10B 12/02; H10B 12/03; H10B 12/30; H10B 12/482; H10B 12/488; H10B 99/00
See application file for complete search history.

(56) References Cited

U.S. PATENT DOCUMENTS 5,366,910 A  *  11/1994  Ha  .................... H01L 29/66757
                                                    257/E21.414
2021/0125989 A1 *  4/2021  Shin  .................. H01L 27/10805

* cited by examiner

*Primary Examiner* — Nicholas J Tobergte
*Assistant Examiner* — Kevin Quinto
(74) *Attorney, Agent, or Firm* — IP & T GROUP LLP

(57) ABSTRACT

The present invention provides a highly integrated memory cell and a semiconductor device including the same. According to an embodiment of the present invention, the semiconductor device comprises: a plurality of active layers vertically stacked over a substrate; a plurality of bit lines connected to first ends of the active layers, respectively, and extended parallel to the substrate; line-shape air gaps disposed between the bit lines; a plurality of capacitors connected to second ends of the active layers, respectively; and a word line and a back gate facing each other with each of the active layers interposed therebetween, wherein the word line and the back gate are vertically oriented from the substrate.

9 Claims, 48 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0026739, filed on Feb. 26, 2021, which is herein incorporated by reference in its entirety.

BACKGROUND

1. Field

The present invention relates to a semiconductor device, and, more particularly, to a memory cell and a semiconductor device having the same.

2. Description of the Related Art

Recently, in order to increase the net die of semiconductor memory devices, the size of memory cells has been continuously reduced.

As the size of the memory cell is reduced, the parasitic capacitance (Cb) should be reduced and the capacitance should be increased. However, it is difficult to increase the net die due to structural limitations of the memory cell.

SUMMARY

Various embodiments of the present invention provide a highly integrated memory cell and a semiconductor device including the same.

According to an embodiment of the present invention, a semiconductor device comprises: a plurality of active layers vertically stacked over a substrate; a plurality of bit lines connected to first ends of the active layers, respectively, and extended parallel to the substrate; line-shape air gaps disposed between the bit lines; a plurality of capacitors connected to second ends of the active layers, respectively; and a word line and a back gate facing each other with each of the active layers interposed therebetween, wherein the word line and the back gate are vertically oriented from the substrate.

According to an embodiment of the present invention, a semiconductor device comprises: a plurality of active layers vertically stacked over a substrate; a plurality of bit lines connected to first ends of the active layers, respectively, and extended parallel to the substrate; line-shape air gaps disposed between the bit lines; a plurality of capacitors connected to second ends of the active layers, respectively; and a word line and a vertical shape air gap facing each other with the active layers interposed therebetween, wherein the word line and the vertical shape air gap are vertically oriented from the substrate.

According to an embodiment of the present invention, a method for fabricating a semiconductor device comprises: forming a mold stack in which insulating layers and sacrificial layers alternate over a substrate; forming a plurality of isolation layers penetrating through the mold stack; substituting some of the sacrificial layers between the isolation layers with semiconductor layers; forming a vertical shape word line and a vertical shape back gate, both vertically penetrating through the isolation layers and facing each other with the semiconductor layers interposed therebetween; forming bit lines connected to first ends of the semiconductor layers, respectively, and extended parallel to the substrate; and forming laterally oriented capacitors connected to second ends of the semiconductor layers, respectively.

It is possible to improve memory cell density because the present invention vertically stacks memory cells.

Parasitic capacitance between bit lines can be reduced because the present invention vertically stacks memory cells.

The present invention can block interference between neighboring word lines by a back gate or a vertical air gap.

DETAILED DESCRIPTION

Figure 1:
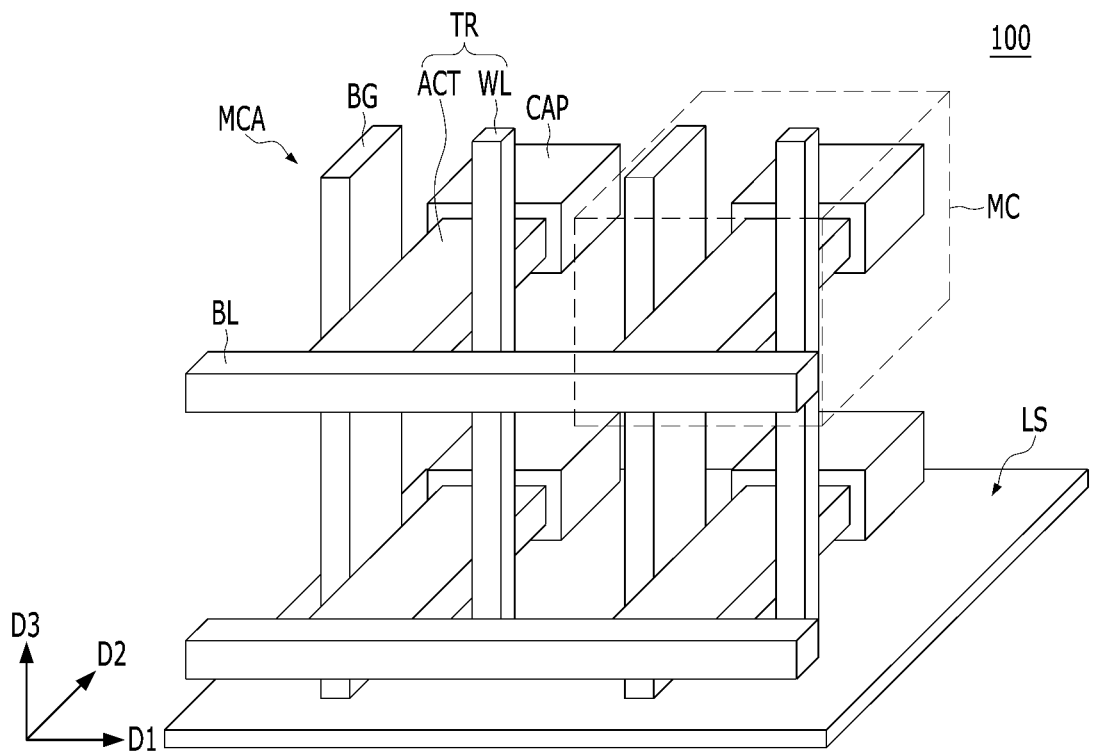
FIG. 1 is a schematic perspective view illustrating a semiconductor device according to an embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. The embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

An embodiment of the present invention described below may increase the memory cell density and reduce the parasite capacitance by stacking memory cells vertically.

Figure 2A:
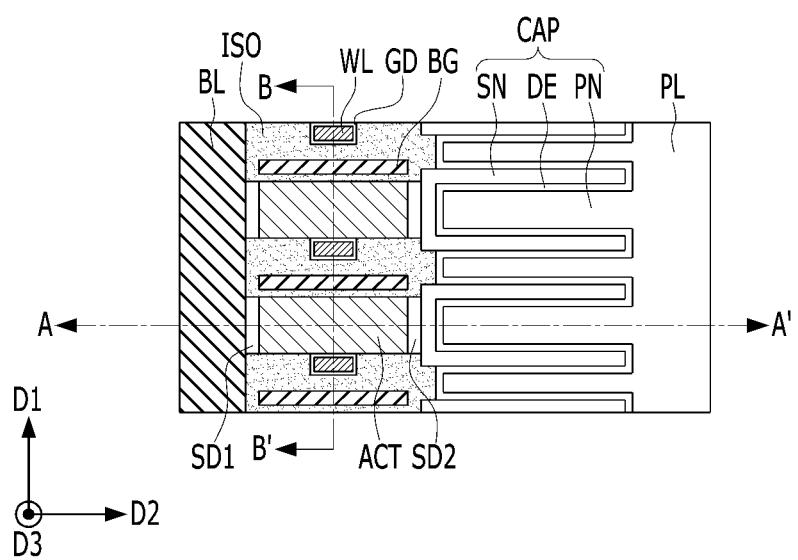
FIG. 2A is a layout diagram illustrating a semiconductor device.
Figure 2B:
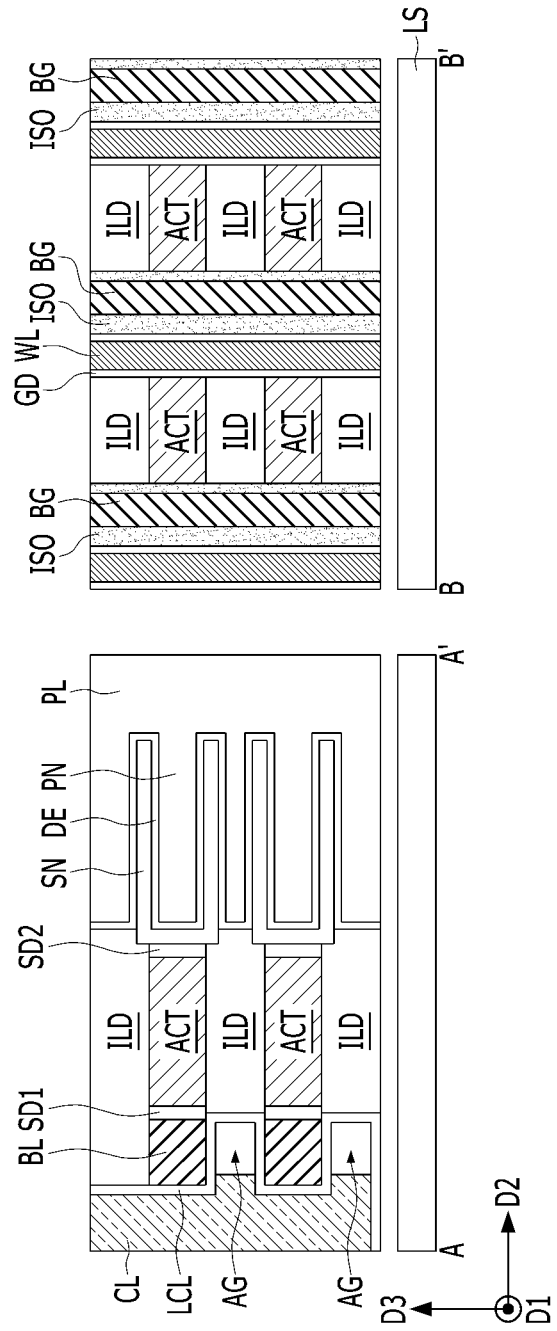
FIG. 2B shows cross-sectional views taken along lines A-A' and B-B' of FIG. 2A.

FIG. 1 is a schematic perspective view illustrating a semiconductor device according to an embodiment. FIG. 2A is a layout of a semiconductor device. FIG. 2B shows cross-sectional views taken along lines A-A' and B-B' of FIG. 2A.

Referring to FIGS. 1 to 2B, the semiconductor device 100 may include a substrate LS, and a memory cell array MCA formed on the substrate LS. The memory cell array MCA may be vertically oriented with respect to a surface of the substrate LS, e.g., a top surface of the substrate LS. The top surface of the substrate LS may define a plane. The memory cell array MCA may be vertically oriented to the plane of the substrate LS. The memory cell array MCA may be disposed on an etch stop layer (not shown) formed on the substrate LS. The memory cell array MCA may include a plurality of memory cells. The memory cell array MCA may include a three-dimensional array of memory cells MC. Each of the memory cells MC of the memory cell array MCA may include a bit line BL, a transistor TR, a capacitor CAP, and a plate line PL. The bit line BL may be disposed over the substrate LS and may be extended in a first direction D1 parallel to the surface of the substrate LS. The transistor TR and the capacitor CAP may be laterally oriented along a second direction D2. The memory cell array MCA may be vertically oriented upwardly from the substrate LS along a third direction D3. The first direction D1 may refer to a direction vertical to the second direction D2, and the third direction D3 may refer to a direction vertical to both the first direction D1 and the second direction D2. Each of the memory cells MC may further include a word line WL extending vertically along the third direction D3. The bit line BL may be laterally oriented along the first direction D1. In each of the memory cells MC, the bit line BL, the transistor TR, the capacitor CAP, and the plate line PL may be disposed in a lateral arrangement along the second direction D2. The memory cell array MCA may include a dynamic random-access memory (DRAM) cell array. In another embodiment, the memory cell array MCA may include a phase-change random access memory (PCRAM), a resistive random-access memory (RERAM), a magnetoresistive random-access memory (MRAM), and the like. The capacitor CAP may be replaced with other memory elements.

The substrate LS may be a material suitable for semiconductor processing. The substrate LS may include at least one of a conductive material, an insulating material, and a semiconductor material. The substrate LS may include a semiconductor substrate. The substrate LS may be made of a semiconductor material containing silicon. The substrate LS may include silicon, monocrystalline silicon, polysilicon, amorphous silicon, silicon germanium, monocrystalline silicon germanium, polycrystalline silicon germanium, carbon-doped silicon, a combination thereof, or a multilayer thereof. The substrate LS may include other semiconductor materials such as germanium. The substrate LS may include a III/V group semiconductor substrate, for example, a compound semiconductor substrate such as GaAs. The substrate LS may include a silicon on insulator (SOI) substrate.

In another embodiment, the substrate LS may include a peripheral circuit region (not shown). The peripheral circuit region may include a plurality of control circuits for controlling the memory cell array MCA. At least one control circuit of the peripheral circuit region may include an N-channel transistor, a P-channel transistor, a CMOS circuit, or a combination thereof. At least one control circuit of the peripheral circuit region may include an address decoder circuit, a read circuit, and a write circuit. At least one control circuit of the peripheral circuit region may include a planar channel transistor, a recess channel transistor, a buried gate transistor, a fin channel transistor (FinFET), and so on.

For example, at least one control circuit of the peripheral circuit region may be electrically connected to the bit line BL. The peripheral circuit region may include a sense amplifier, and the sense amplifier may be electrically connected to the bit line BL. Although not shown, a multi-level metal interconnection may be disposed between the memory cell array MCA and the substrate LS, and the peripheral circuit region and the bit line BL may be interconnected through the multi-level metal interconnection (MLM).

Various materials may be formed on the substrate LS. The bit line BL may be spaced apart from the substrate LS and laterally oriented along the first direction D1. The bit line BL may be referred to as a laterally-oriented bit line or a laterally-extended bit line. The bit line BL may include a conductive material. The bit line BL may include a silicon-based material, a metal-based material, or a combination thereof. The bit line BL may include polysilicon, metal, metal nitride, metal silicide, or a combination thereof. The memory cells MC arranged laterally along the first direction D1 may share one bit line BL. The bit line BL may include polysilicon, titanium nitride, tungsten, or a combination thereof. For example, the bit line BL may include polysilicon doped with an N-type impurity or titanium nitride (TiN). The bit line BL may include a stack of titanium nitride and tungsten (TiN/W). The bit line BL may further include an ohmic contact layer such as metal silicide.

The transistor TR may be disposed in a lateral arrangement along the second direction D2 parallel to the surface of the substrate LS. The transistor TR may be laterally positioned between the bit line BL and the capacitor CAP. The transistor TR may be disposed at a higher level than the substrate LS. The transistor TR and the substrate LS may be spaced apart from each other.

The transistor TR may include an active layer ACT, a gate insulating layer GD, and a word line WL. The word line WL may extend vertically along the third direction D3, and the active layer ACT may extend laterally along the second direction D2. The active layer ACT may be laterally arranged from the bit line BL. The active layer ACT may be oriented parallel to the plane of the substrate LS.

The word line WL may have a pillar-shape. A gate insulating layer GD may be formed between the word line WL and the active layer ACT. The gate insulating layer GD may be formed on some sidewalls of the active layer ACT.

The gate insulating layer GD may include silicon oxide, silicon nitride, metal oxide, metal oxynitride, metal silicate, a high-k material, a ferroelectric material, antiferroelectric material, or a combination thereof. The gate insulating layer GD may include $SiO_2$, $Si_3N_4$, $HfO_2$, $Al_2O_3$, $ZrO_2$, AlON, HfON, HfSiO, HfSiON, and so on.

The word line WL may include a metal, a metal mixture, a metal alloy, or a semiconductor material. The word line WL may include titanium nitride, tungsten, polysilicon, or a combination thereof. For example, the word line WL may include a TiN/W stack in which titanium nitride and tungsten are sequentially stacked. The word line WL may include an N-type workfunction material or a P-type workfunction material. The N-type workfunction material may have a low workfunction of 4.5 or less, and the P-type workfunction material may have a high workfunction of 4.5 or more.

The word line WL and the bit line BL may extend in directions crossing each other.

In an embodiment, the active layer ACT may include a semiconductor material. In another embodiment, the active layer ACT may include an oxide semiconductor material. The active layer ACT may include a plurality of impurity regions. The impurity regions may include a first source/drain region SD1 and a second source/drain region SD2. The active layer ACT may include doped polysilicon, undoped polysilicon, amorphous silicon, or IGZO. The first and the second source/drain regions SD1 and SD2 may be doped with an N-type impurity or a P-type impurity. The first source/drain region SD1 and the second source/drain region SD2 may be doped with the same conductivity type impurity. The first source/drain region SD1 and the second source/drain region SD2 may be doped with an N-type impurity. The first source/drain region SD1 and the second source/drain region SD2 may be doped with a P-type impurity. The first source/drain region SD1 and the second source/drain region SD2 may at least include any impurity selected from among arsenic (As), phosphorus (P), boron (B), indium (Indium, In), or a combination thereof. The bit line BL may be electrically connected to a first edge portion of the active layer ACT. The capacitor CAP may be electrically connected to a second edge portion of the active layer ACT. The first edge portion of the active layer ACT may include the first source/drain region SD1, and the second edge portion of the active layer ACT may include the second source/drain region SD2.

The active layers ACT may be spaced apart from and supported by the isolation layer ISO. The isolation layer ISO may be extended vertically along the third direction D3. The isolation layer ISO may be disposed between neighboring memory cells MC along the first direction D1. The memory cells MC stacked along the third direction D3 may be spaced apart from each other by an interlayer insulating layer ILD. The isolation layer ISO and the interlayer insulating layer ILD may include an insulating material such as silicon oxide.

The capacitor CAP may be laterally disposed from the transistor TR. The capacitor CAP may laterally be extended from the active layer ACT along the second direction D2. The capacitor CAP may include a storage node SN, a dielectric layer DE, and a plate node PN. The storage node SN, the dielectric layer DE, and the plate node PN may be laterally arranged along the second direction D2. The storage node SN may have a laterally oriented cylinder-shape, and the plate node PN may have a shape expanding into a cylinder inner wall and a cylinder outer wall of the storage node SN. The dielectric layer DE may be disposed inside the cylinder of the storage node SN and may surround the plate node PN. The plate node PN may be connected to the plate line PL. The storage node SN may be electrically connected to the second source/drain region SD2.

The capacitor CAP may include a Metal-Insulator-Metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. A high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the high-k materials mentioned above.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as $ZrO_2$-based layer. In another embodiment, the dielectric layer DE may be formed of hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as hafnium oxide-based layer ($HfO_2$-based layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than that of the high-k material. The dielectric layer DE may include silicon oxide ($SiO_2$) as a high band gap material other than aluminum oxide ($Al_2O_3$). Since the dielectric layer DE contains a high band gap material, leakage current may be suppressed. The high band gap material may be thinner than the high-k material. In another embodiment, the dielectric layer DE may include a laminated structure in which a high-k material and a high band gap material are alternately stacked. For example, the laminated structure may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3/HfO_2/Al_2O_3/HfO_2/Al_2O_3$) or HAHAH($HfO_2/Al_2O_3/HfO_2/Al_2O_3/HfO_2/Al_2O_3/HfO_2/Al_2O_3/HfO_2$). In the laminated structure as described above, aluminum oxide ($Al_2O_3$) may be thinner than zirconium oxide ($ZrO_2$) and hafnium oxide ($HfO_2$).

In another embodiment, the dielectric layer DE may include a stack structure including zirconium oxide, hafnium oxide, and aluminum oxide, a laminated structure, or an intermixing structure.

In another embodiment, an interface control layer (not shown) for improving leakage current may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling inside the cylinder of the storage node SN, the titanium nitride (TiN) may practically serve as the plate node of the capacitor CAP, and tungsten nitride may be a low-resistance material. The neighboring plate nodes PN may be commonly connected to the plate line PL. The bottom of the plate line PL may be insulated from the base substrate LS.

The storage node SN may have a three-dimensional (3D) structure. The storage node SN may have a 3D structure laterally oriented along the second direction D2. As an example of a 3D structure, the storage node SN may have a cylinder shape, a pillar shape, or a pylinder shape. Here, the pylinder shape may refer to a structure in which a pillar shape and a cylinder shape are merged. For example, a pylinder may have a first part having the shape of a pillar and a second part having the shape of a cylinder connected to each other.

The active layers ACT, the bit lines BL, and the storage nodes SN may be located at a same level.

Referring to FIG. 2B again, the interlayer insulating layers ILD and the active layers ACT may be alternately stacked along the third direction D3. The bit lines BL and air gaps AG may be alternately stacked along the third direction D3. Each of the air gaps AG may be located below a corresponding bit line BL. The bit lines BL and the air gaps AG may vertically overlap. The air gaps AG may be defined by a capping layer CL. That is, the air gaps AG may be embedded in the capping layer CL. A liner capping layer LCL may be further formed between the capping layer CL and the bit lines BL. An air gap AG may be positioned between the capping layer CL and the liner capping layer LCL. The capping layer CL and the liner capping layer LCL may include an insulating material.

Referring to FIGS. 1 and 2A again, the word line WL and a back gate BG may face each other along the first direction D1 with the active layers ACT interposed therebetween. The back gate BG may extend vertically along the third direction D3. The memory cells MC stacked along the third direction D3 may share the word line WL and the back gate BG. The back gate BG and the word line WL may be formed of the same material. A length of the back gate BG along the second direction D2 may be greater than a length of the word line WL along the second direction D2.

Different potentials may be applied to the word line WL and the back gate BG. For example, a word line driving voltage may be applied to the word line WL, and a reference (e.g., ground voltage) may be applied to the back gate BG. Interference between the neighboring word lines WL may be blocked by the back gate BG.

FIGS. 3A to 20B are diagrams illustrating a method for fabricating a semiconductor device according to an embodiment of the present invention. Hereinafter, FIGS. 3A to 20A are layout diagrams, and FIGS. 3B to 20B are cross-sectional views taken along lines A-A' and B-B' of FIGS. 3A to 20A. FIGS. 3A to 20A may be a layout diagram at a level of the sacrificial layer (or the active layer).

Figure 3A:
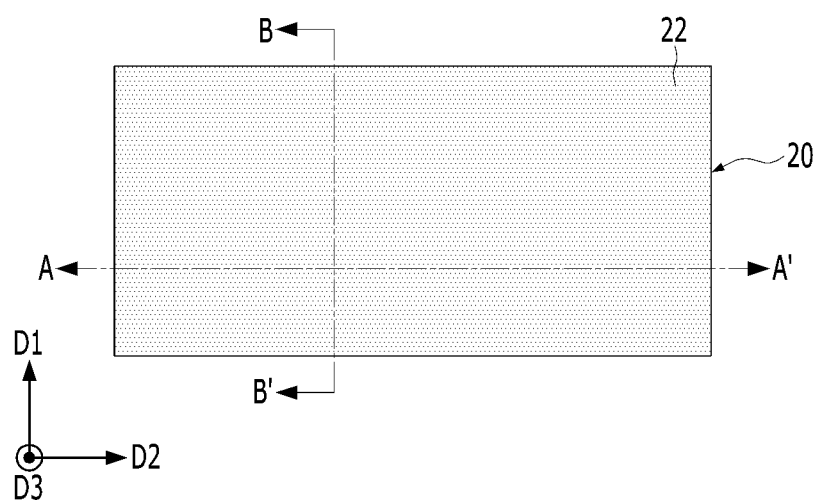
FIGS. 3A to 20B are diagrams illustrating a method for fabricating a semiconductor device according to an embodiment of the present invention.
Figure 3B:
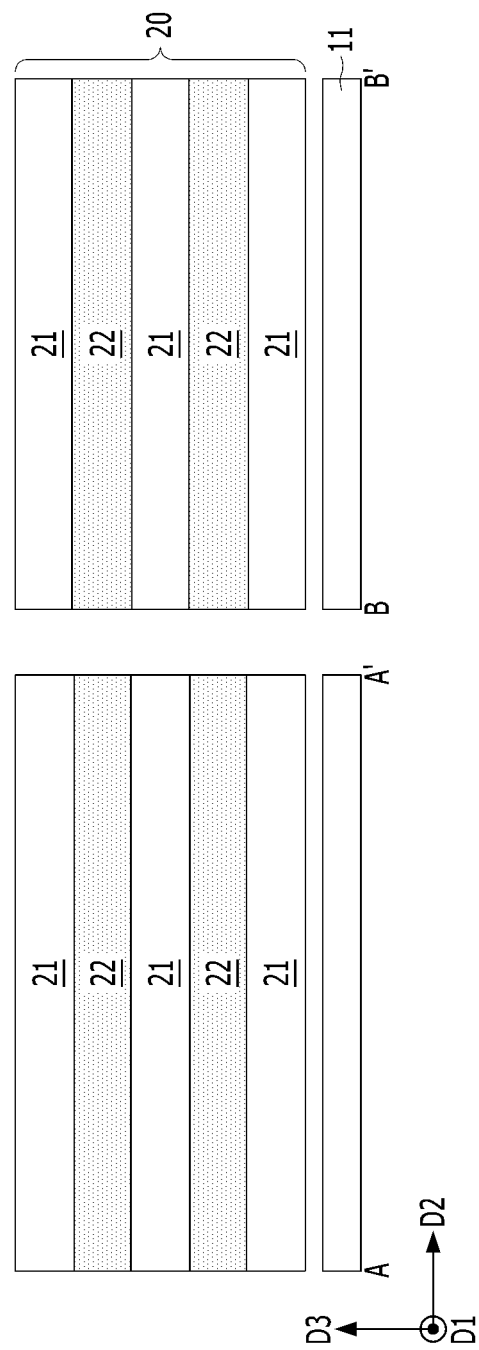

As shown in FIGS. 3A and 3B, a mold stack 20 may be formed on a substrate 11. The mold stack 20 may include an insulating layer 21 and a sacrificial layer 22. For example, the mold stack 20 may include a plurality of insulating layers 21 and a plurality of sacrificial layers 22 which are alternately stacked. The insulating layers 21 and the sacrificial layers 22 may be vertically stacked along the third direction D3 perpendicular to the surface of the substrate 11. The insulating layers 21 may include silicon oxide, and the sacrificial layers 22 may include silicon nitride. The lowermost layer and the uppermost layer of the mold stack 20 may be an insulating layer 21. An etch stop layer (not shown) may be formed below the lowermost insulating layer 21.

Figure 4A:
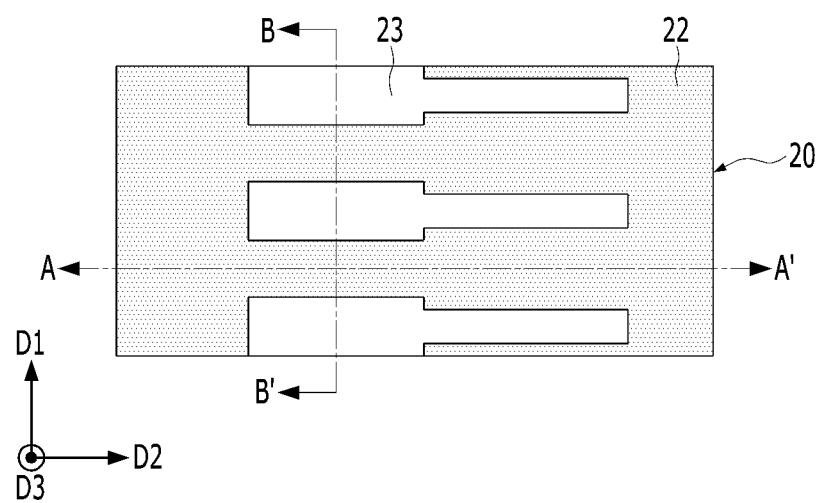
Figure 4B:
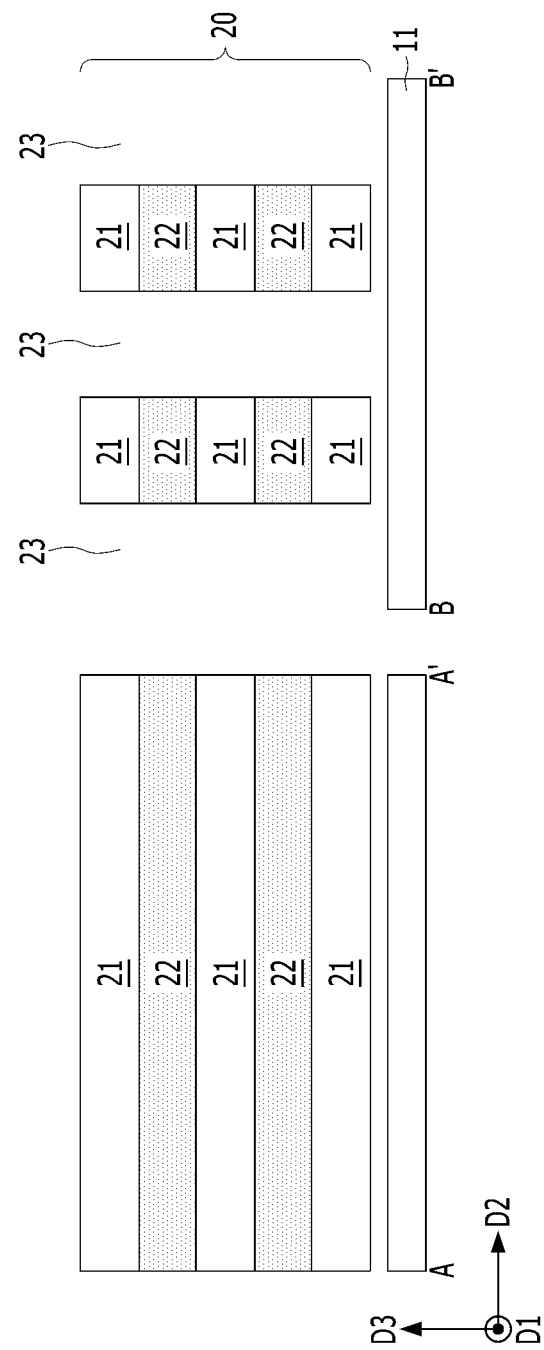

As shown in FIGS. 4A and 4B, a first trench 23 may be formed in the mold stack 20. In order to form the first trench 23, a portion of the mold stack 20 may be etched. The first trench 23 may be extended vertically along the third direction D3, and, when viewed from a top view, may be extended laterally along the second direction D2. The first trench 23 may not expose the substrate 11 because an etch stop layer (not shown) is disposed over the substrate 11. When viewed from a top view, the first trench 23 may include a wide portion and a narrow portion. The wide portion and the narrow portion may each have a rectangular shape. The first trench 23 may pass through a first portion of the mold stack 20.

Figure 5A:
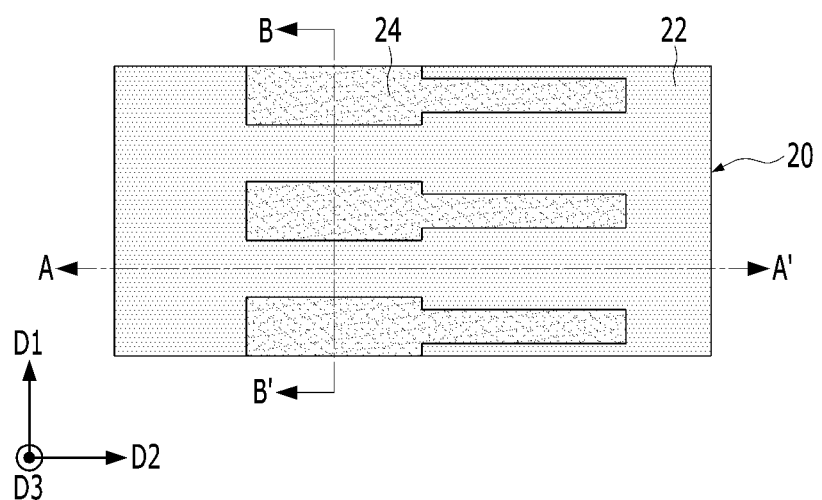
Figure 5B:
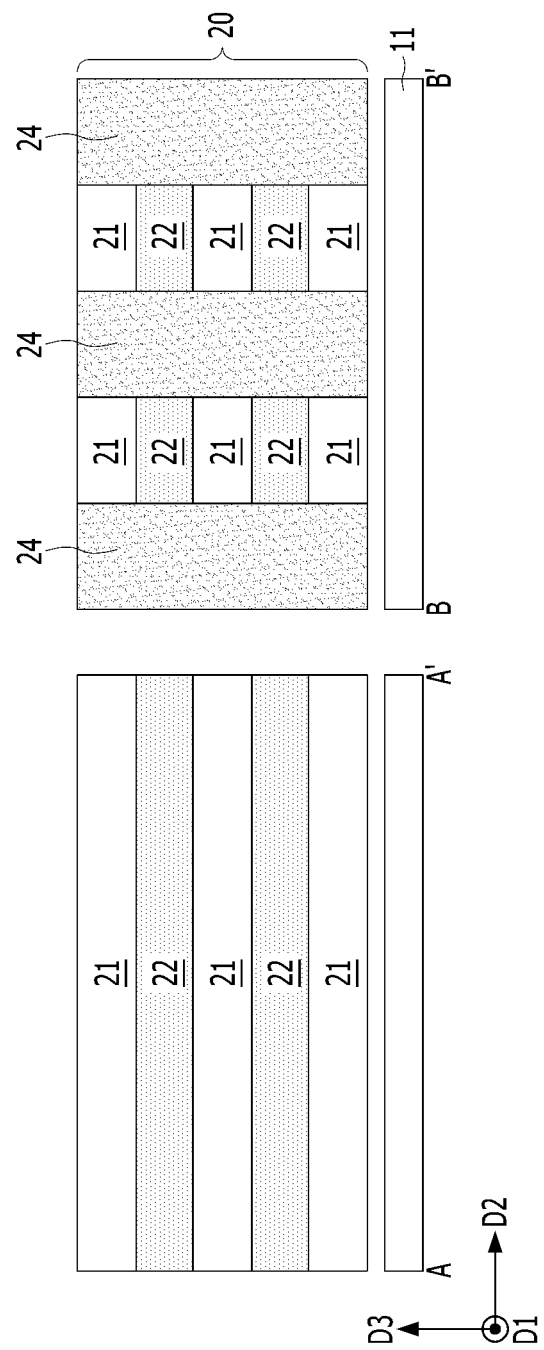

As shown in FIGS. 5A and 5B an isolation layer 24 may be formed in the first trench 23. The isolation layer 24 may include an insulating material. The isolation layer 24 may include silicon oxide. In order to form the isolation layer 24, planarization process may be performed after depositing silicon oxide to fill the first trench 23. When viewed from a top view, the isolation layer 24 may include a wide portion and a narrow portion. The isolation layer 24 may extend vertically along the third direction D3. The isolation layer 24 may be referred to as a vertical isolation layer.

Figure 6A:
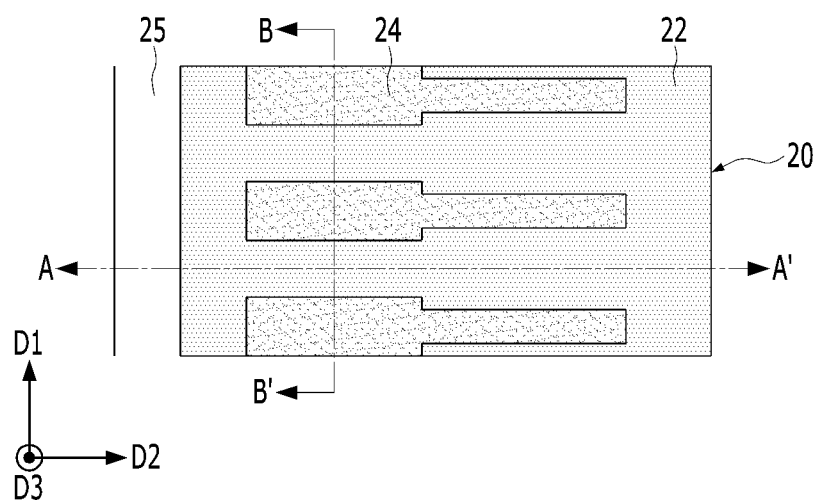
Figure 6B:
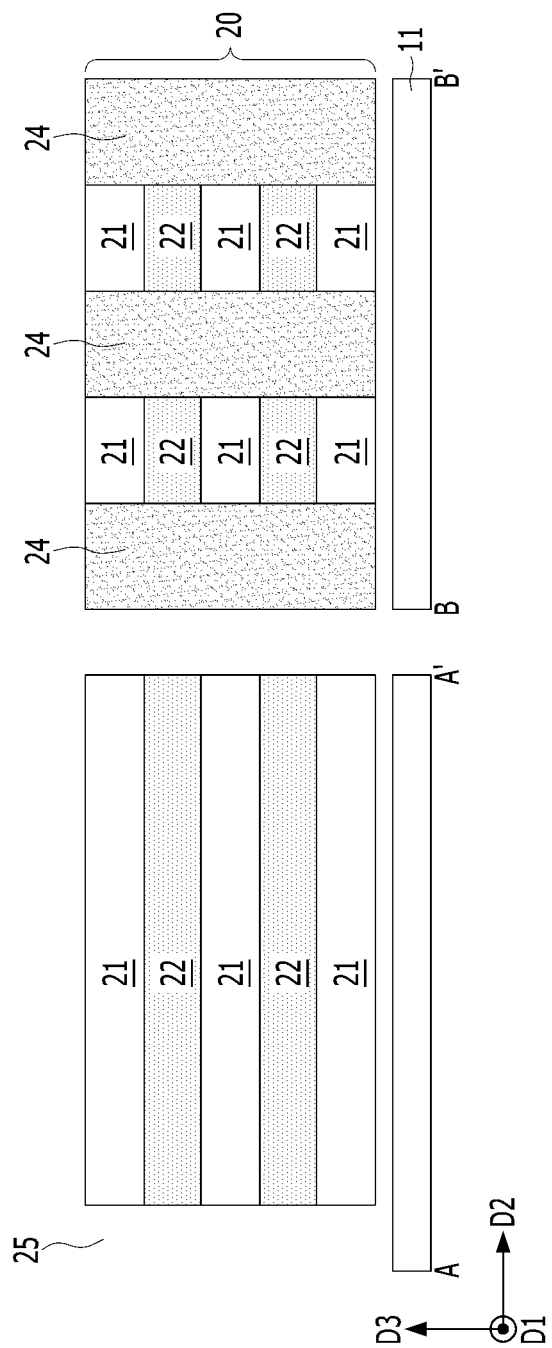

As shown in FIGS. 6A and 6B, a second trench 25 may be formed by etching a part of the mold stack 20. The second trench 25 may be extended vertically along the third direction D3, and may also be extended laterally along the first direction D1. The second trench 25 may be spaced apart from the isolation layer 24. The second trench 25 may pass through a second portion of the mold stack 20.

Figure 7A:
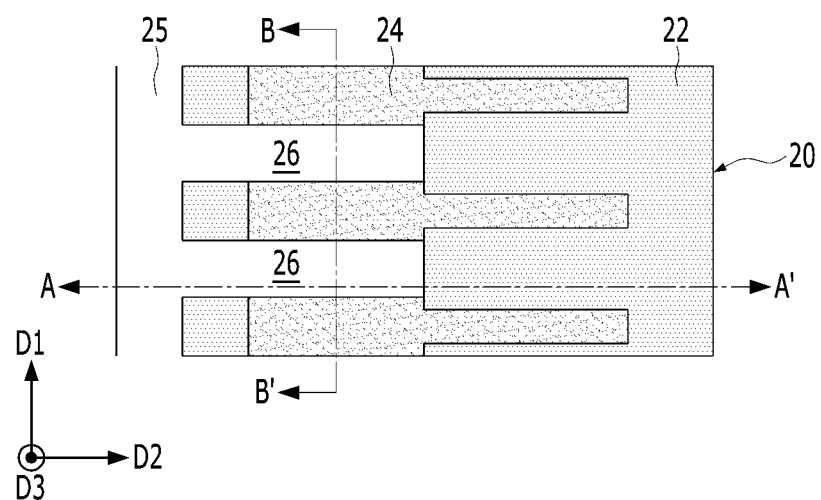
Figure 7B:
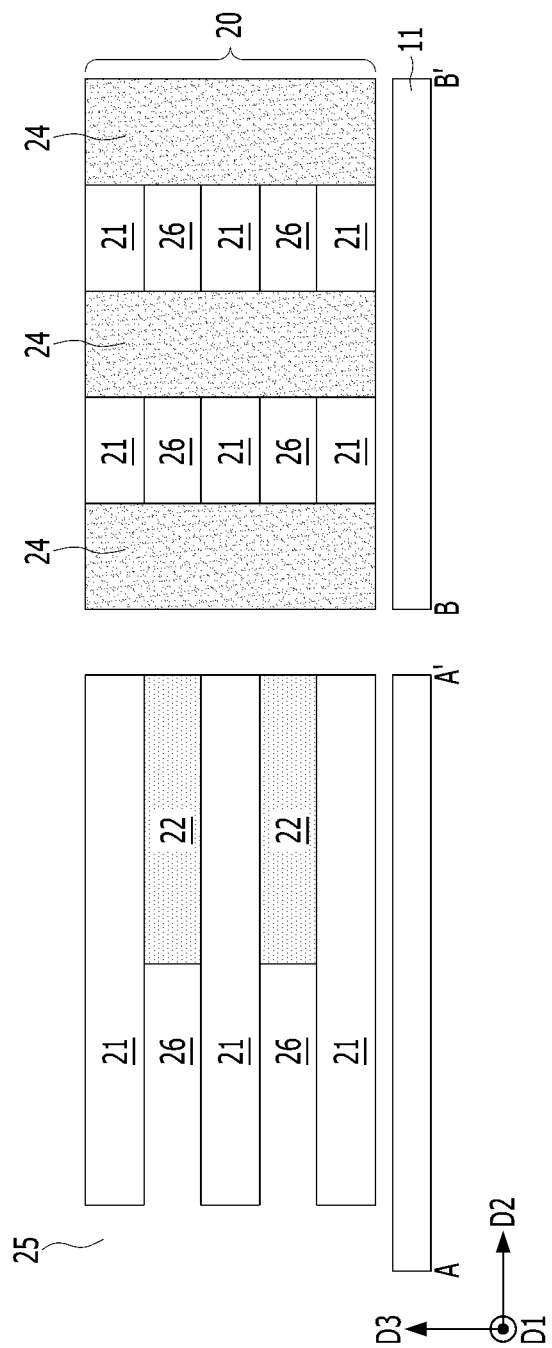

As shown in FIGS. 7A and 7B, some of the sacrificial layers 22 may be removed through the second trench 25. Accordingly, recesses 26 may be formed between the insulating layers 21. The insulating layers 21 and the recesses 26 may alternate along the third direction D3. The recesses 26 may be extended along the second direction D2 and may be disposed between the isolation layers 24 along the first direction D1. The sacrificial layers 22 may remain between the insulating layers 21.

Figure 8A:
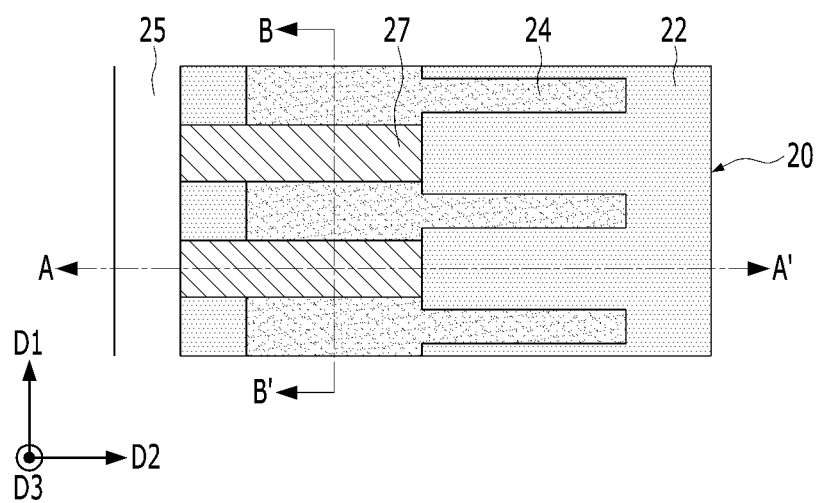
Figure 8B:
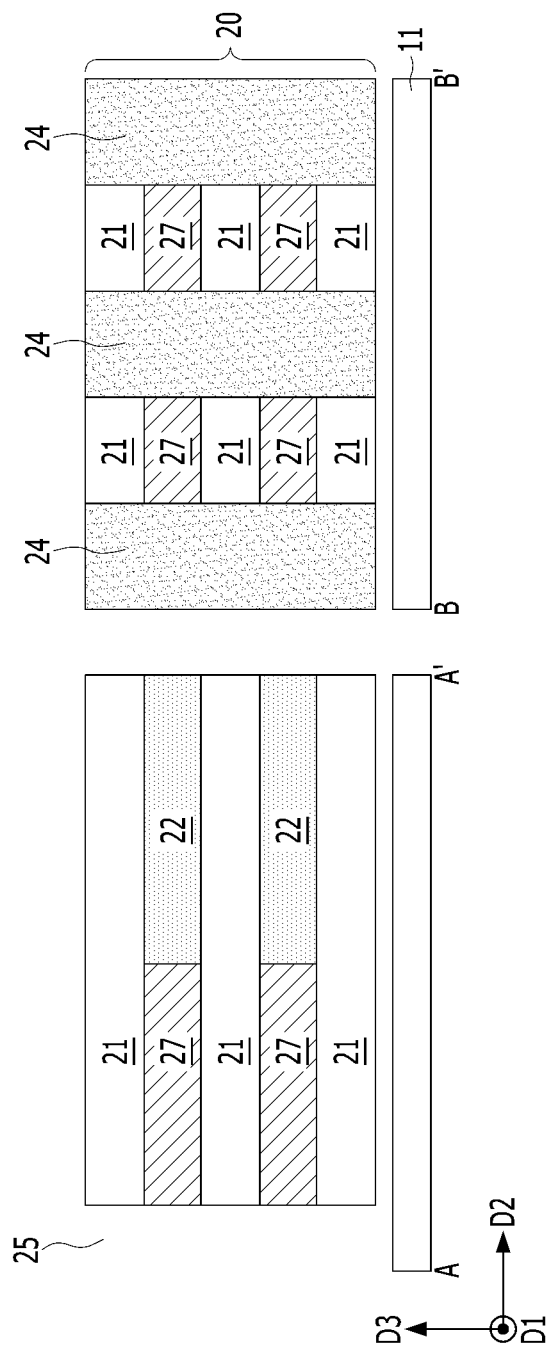

As shown in FIGS. 8A and 8B, semiconductor layers 27 filling each of the recesses 26 may be formed. The semiconductor layers 27 may include a silicon-containing material. The semiconductor layers 27 may include polysilicon. The semiconductor layers 27 and the insulating layers 21 may be alternately stacked along the third direction D3. The semiconductor layers 27 may be extended along the second direction D2 and may be disposed between the isolation layers 24 along the first direction D1. The semiconductor layers 27 may include silicon germanium or an oxide semiconductor material.

Figure 9A:
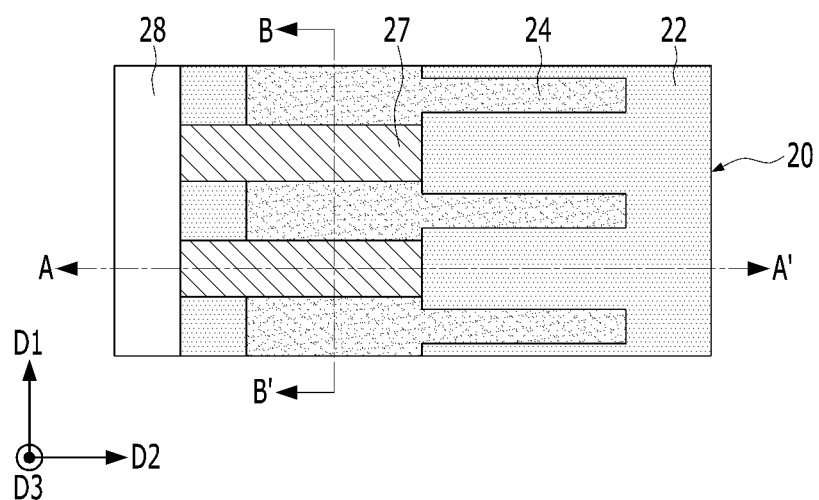
Figure 9B:
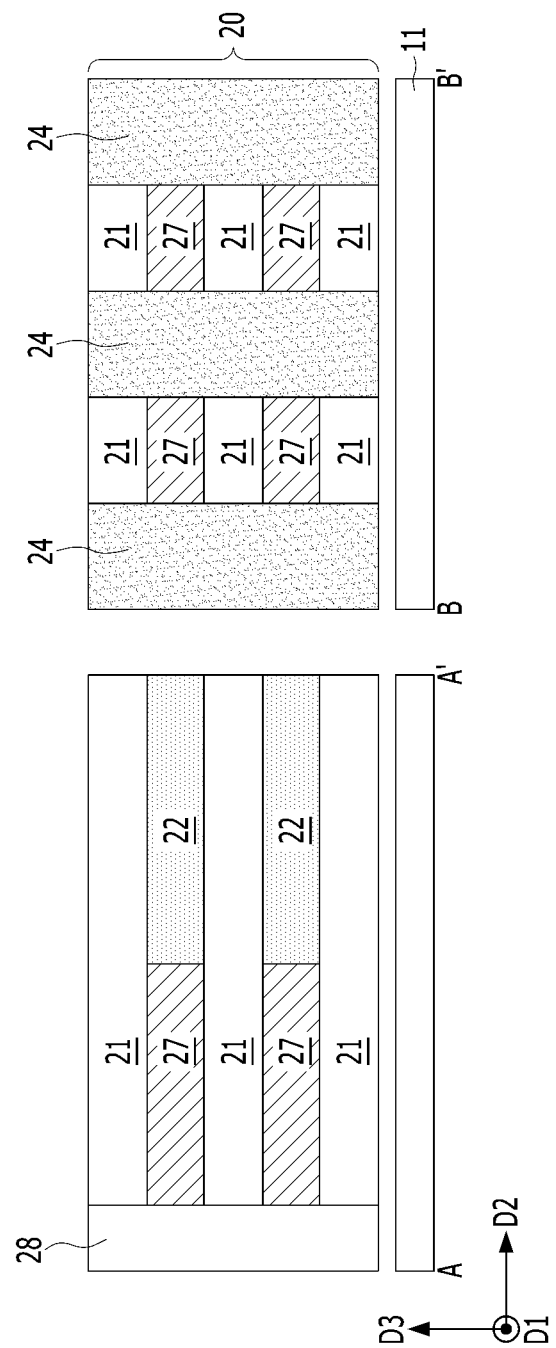

As shown in FIGS. 9A and 9B, a sacrificial insulating layer 28 filling the second trench 25 may be formed. The sacrificial insulating layer 28 may be formed of the same material as the insulating layers 21. The sacrificial insulating layer 28 may include silicon oxide.

Figure 10A:
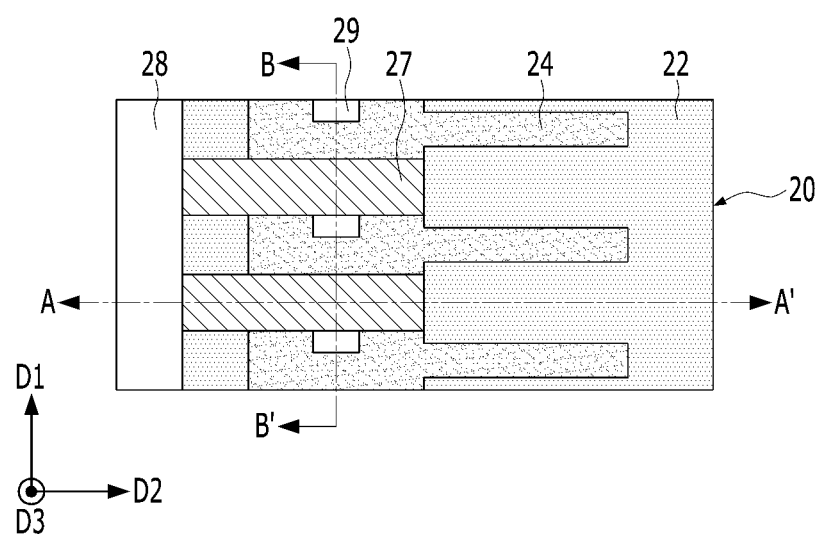
Figure 10B:
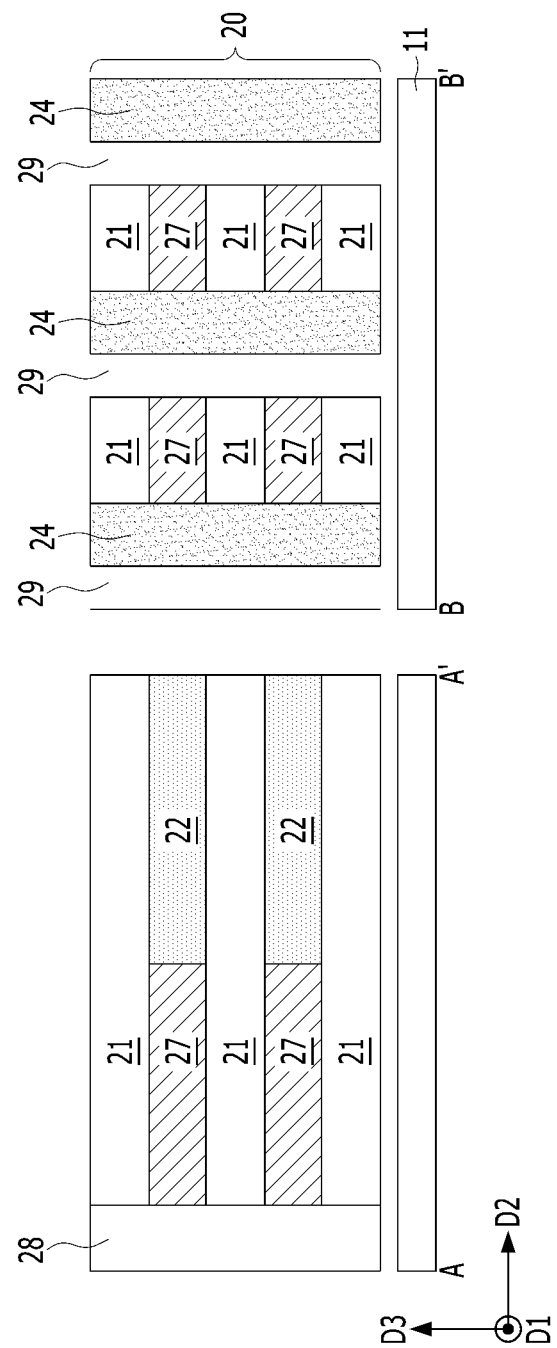

As shown in FIGS. 10A and 10B, first through holes 29 penetrating through the isolation layers 24 may be formed. The first through hole 29 may be extended vertically along the third direction D3 while exposing some sidewalls of the semiconductor layers 27. When viewed from a top view, a cross section of the first through hole 29 may have a rectangular hole shape. In another embodiment, the cross section of the first through hole 29 may have a different shape such as a circle shape. The first through hole 29 may be a vertical opening penetrating through the first portion of the isolation layer 24. The first through hole 29 may be adjacent to one side of the semiconductor layers 27. The first through hole 29 may not expose the side of the semiconductor layers 27 and, in this case, the first through hole 29 may be expanded to expose the side of the semiconductor layers 27 in a following process.

Figure 11A:
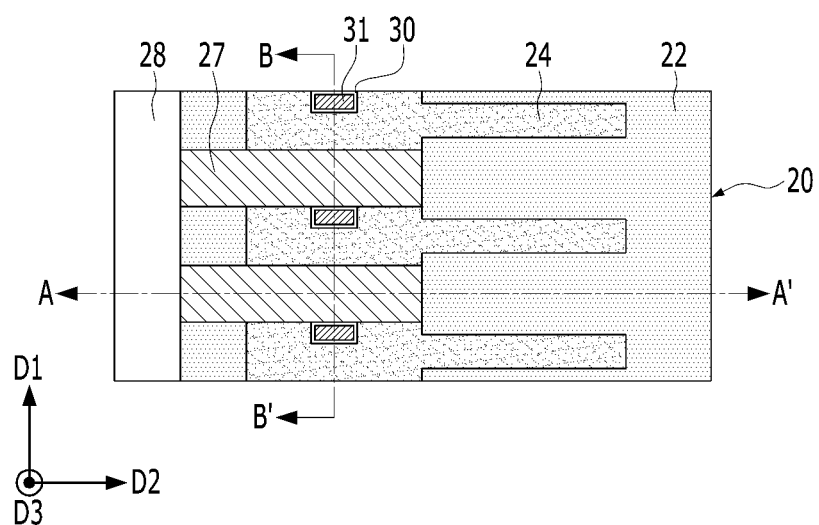
Figure 11B:
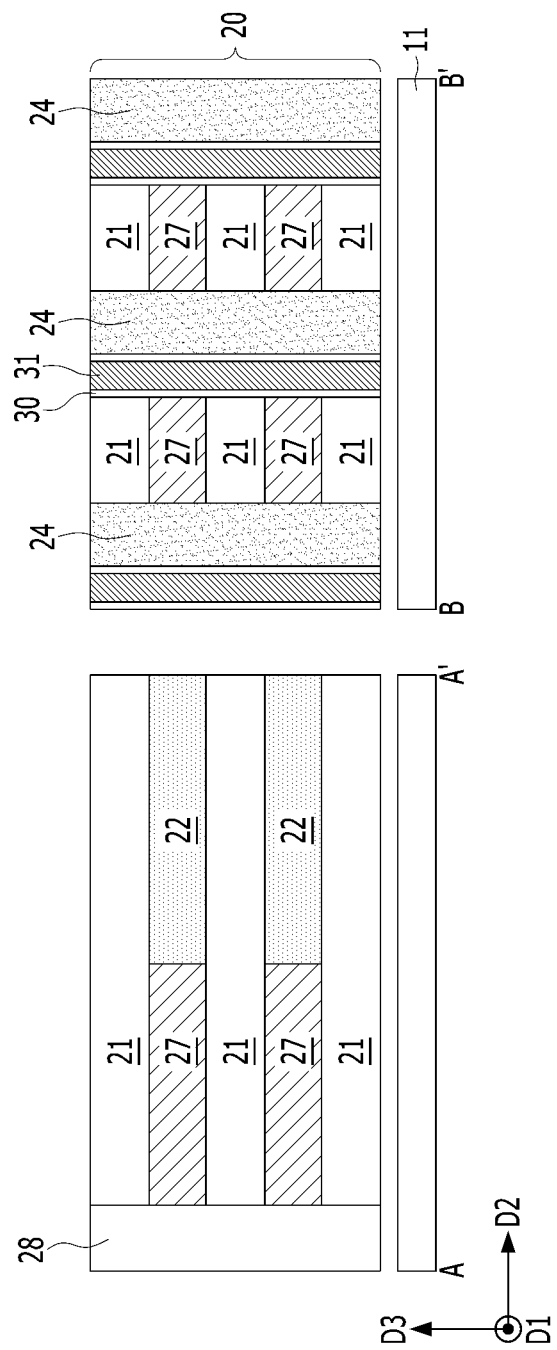

As shown in FIGS. 11A and 11B, a word line 31 penetrating the isolation layer 24 may be formed. The word line 31 may fill the first through hole 29. The word line 31 may be adjacent to one side of the semiconductor layers 27 and may be extended vertically along the third direction D3.

Before forming the word line 31, the exposed sidewall of the semiconductor layers 27 may be selectively oxidized to form the gate insulating layer 30. In another embodiment, the gate insulating layer 30 may be deposited as a continuous layer on the sidewall of the first through hole 29, and then the word line 31 may be formed on the gate insulating layer 30.

The word line 31 may include polysilicon, metal, metal nitride, metal silicide, or a combination thereof. In this embodiment, in order to form the word line 31, a planarization process may be performed after titanium nitride and tungsten are sequentially deposited on the gate insulating layer 30.

Figure 12A:
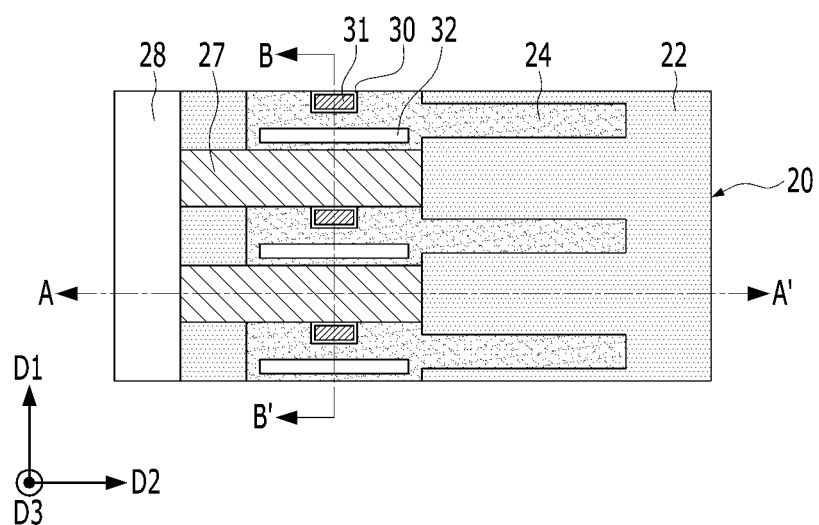
Figure 12B:
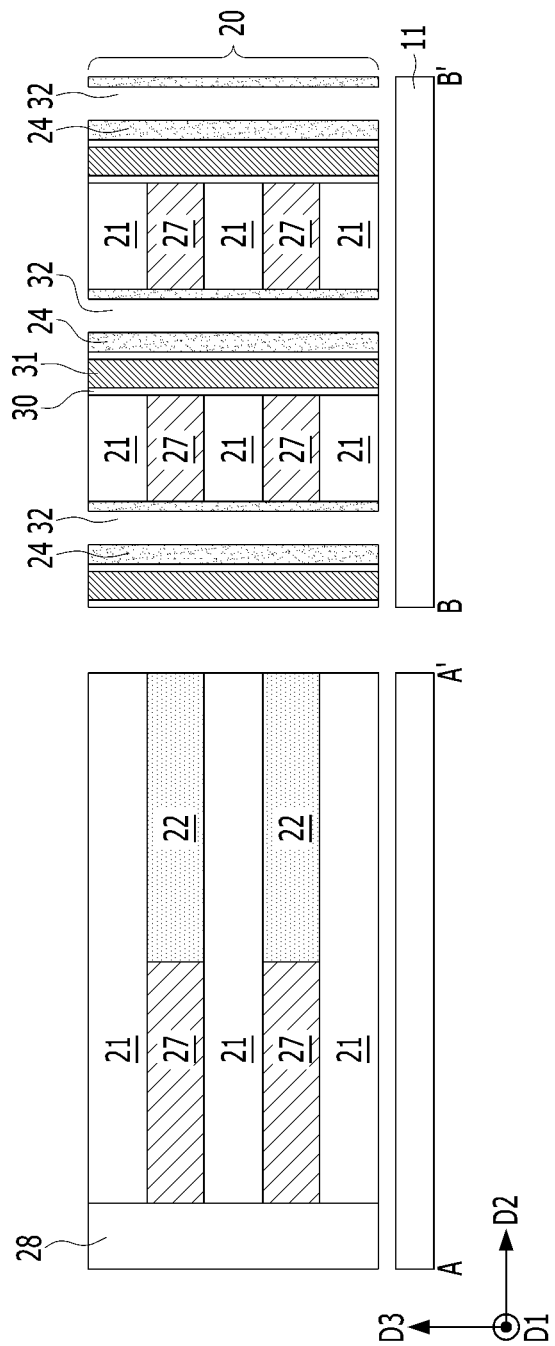

As shown in FIGS. 12A and 12B, second through holes 32 penetrating the isolation layer 24 may be formed. The second through hole 32 may be spaced apart from the word lines 31. The cross-sectional area of the second through hole 32 may be larger than the cross-sectional area of the word line 31. A word line 31 may be adjacent to one side of the semiconductor layers 27, and a second through hole 32 may be adjacent to the other side of the semiconductor layers 27. The second through hole 32 may not expose the other sides of the semiconductor layers 27. The second through hole 32 may be extended vertically along the third direction D3. When viewed from a top view, a cross section of the second through hole 32 may have a rectangular hole shape. In another embodiment, the cross-section of the second through hole 32 may be a different shape such as a circle shape and an ellipse shape. The second through hole 32 may be a vertical opening penetrating through the second portion of the isolation layer 24. The word line 31 and the second through hole 32 may face each other along the first direction D1 with the semiconductor layers 27 interposed therebetween.

Figure 13A:
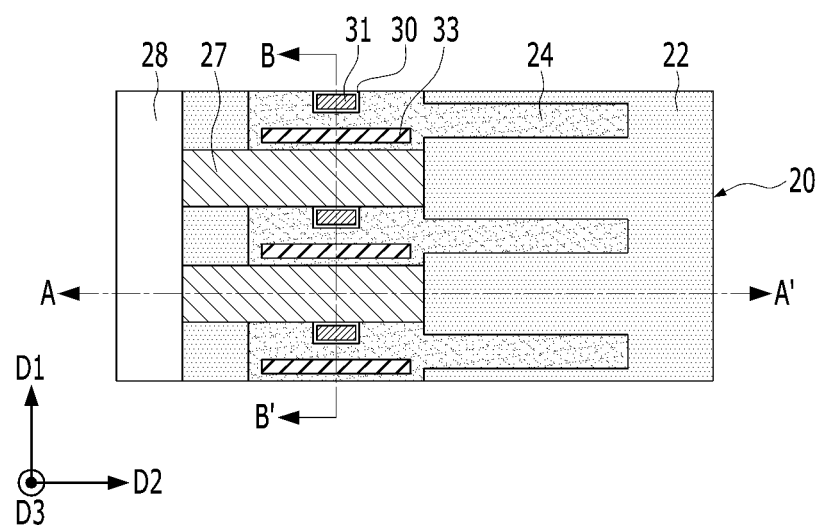
Figure 13B:
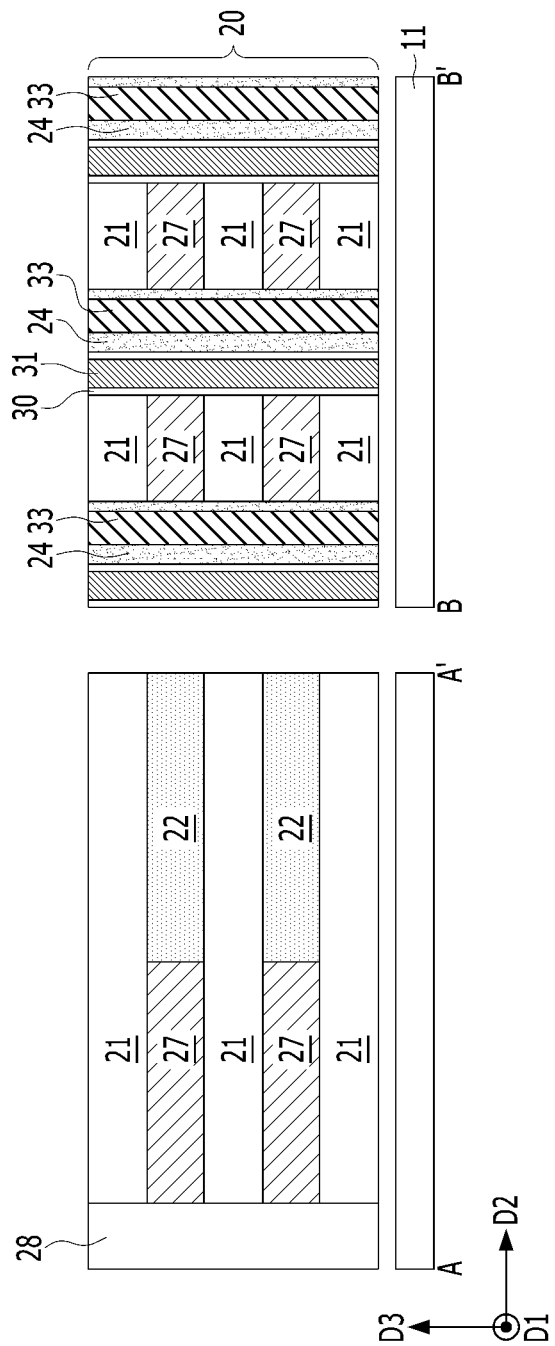

As shown in FIGS. 13A and 13B, a back gate 33 filling the second through holes 32 may be formed. The back gate 33 may be spaced apart from the word line 31. The cross-sectional area of the back gate 33 may be larger than the cross-sectional area of the word line 31. The word line 31 may be adjacent to one side of the semiconductor layers 27, and the back gate 33 may be adjacent to the other side of the semiconductor layers 27. The back gate 33 may be extended vertically along the third direction D3 while being adjacent to the other side surfaces of the semiconductor layers 27. When viewed from a top view, the cross section of the back gate 33 may have a rectangular hole shape. In another embodiment, the cross section of the back gate 33 may be a circle shape or an ellipse shape.

The back gate 33 and the word line 31 may be made of the same material. The back gate 33 may include polysilicon, metal, metal nitride, metal silicide, or a combination thereof. In this embodiment, in order to form the back gate 33, titanium nitride and tungsten may be sequentially deposited to fill the second through hole 32 and then planarization may be performed. The other sides of the back gate 33 and the semiconductor layers 27 may be spaced apart from each other by the isolation layer 24.

As described above, the word line 31 and the back gate 33 may face each other along the first direction D1 with the semiconductor layers 27 interposed therebetween. The word line 31 and the back gate 33 may be extended vertically along the third direction D3. The semiconductor layers 27 stacked along the first direction D3 may share the word line 31 and the back gate 33. The word line 31 and the back gate 33 may have a pillar shape passing through the isolation layer 24 along the third direction D3.

Figure 14A:
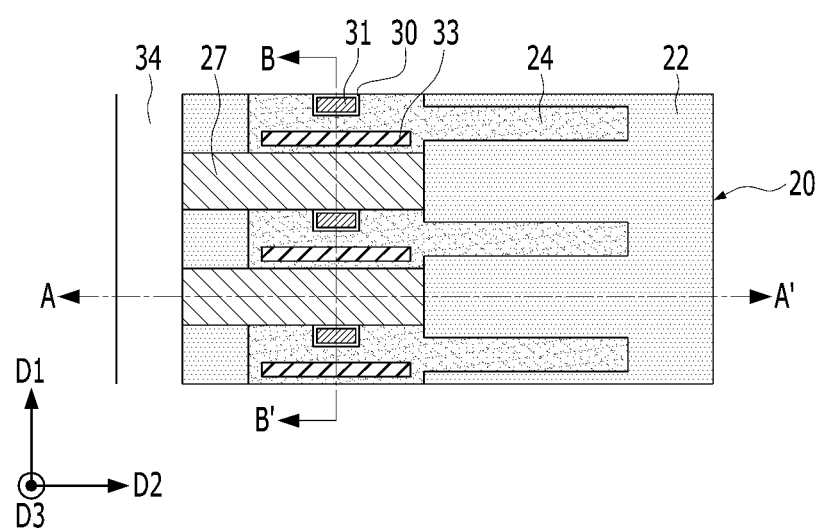
Figure 14B:
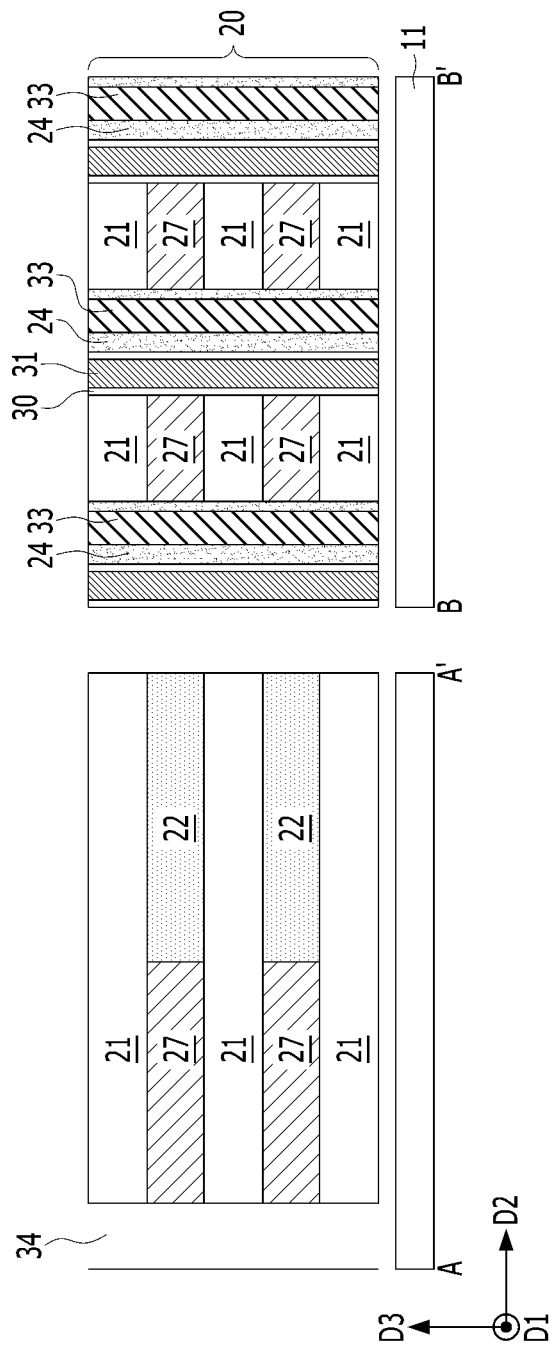

As shown in FIGS. 14A and 14B, the sacrificial insulating layer 28 may be selectively removed. Accordingly, a third trench 34 may be formed. One ends of the semiconductor layers 27 may be exposed by the third trench 34. The third trench 34 may be the same as the second trench 25 of FIGS. 6A and 6B.

Figure 15A:
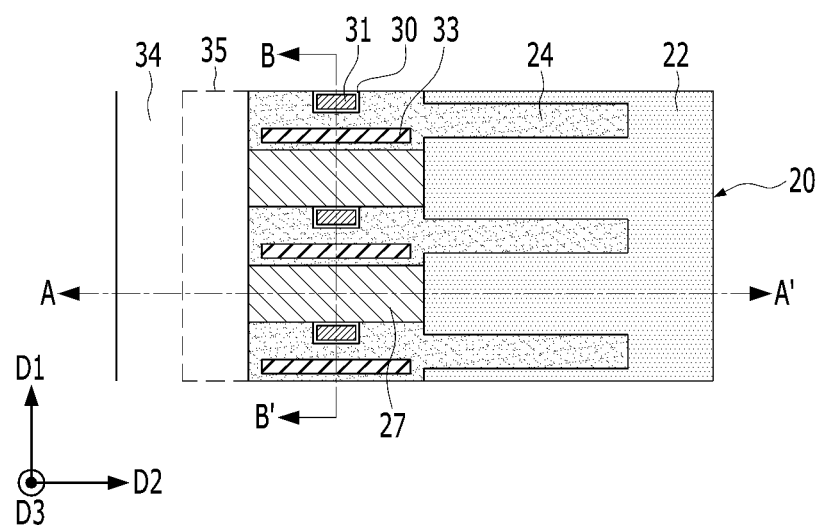
Figure 15B:
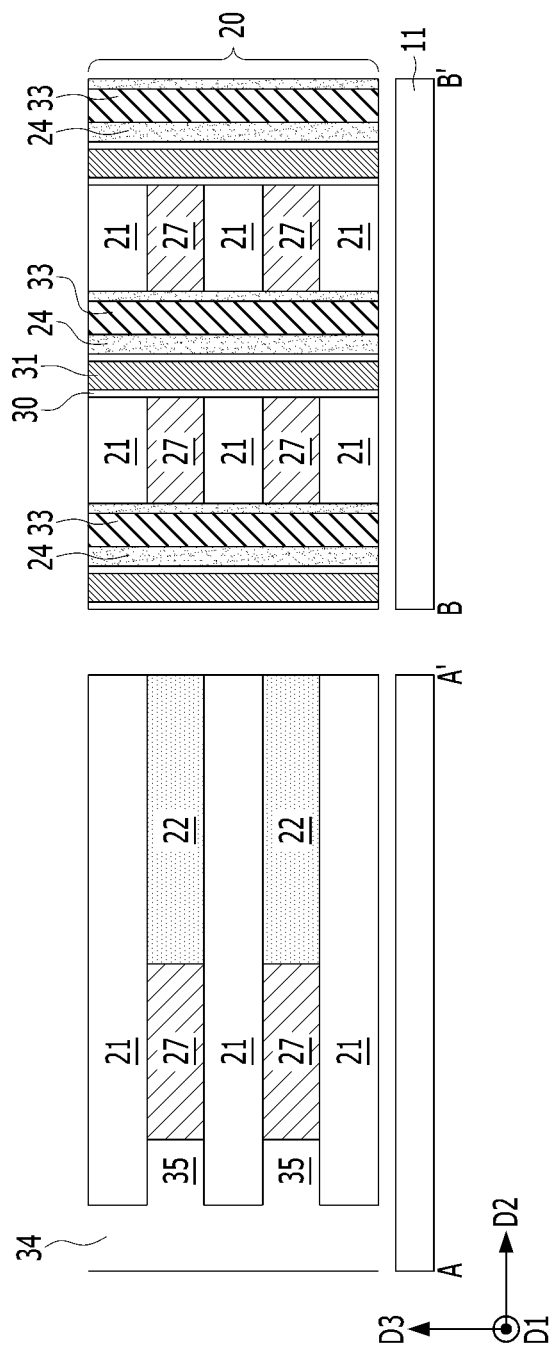

As shown in FIGS. 15A and 15B, bit line recesses 35 may be formed by selectively recessing the semiconductor layers 27. The bit line recesses 35 may be formed between the insulating layers 21 along the third direction D3. In order to form the bit line recesses 35, selective etching of the sacrificial layers 22 may be additionally performed. Accordingly, the bit line recesses 35 may be laterally extended along the first direction D1. Each of the bit line recesses 35 may simultaneously expose first ends of the adjacent semiconductor layers 27 along the first direction D1.

Figure 16A:
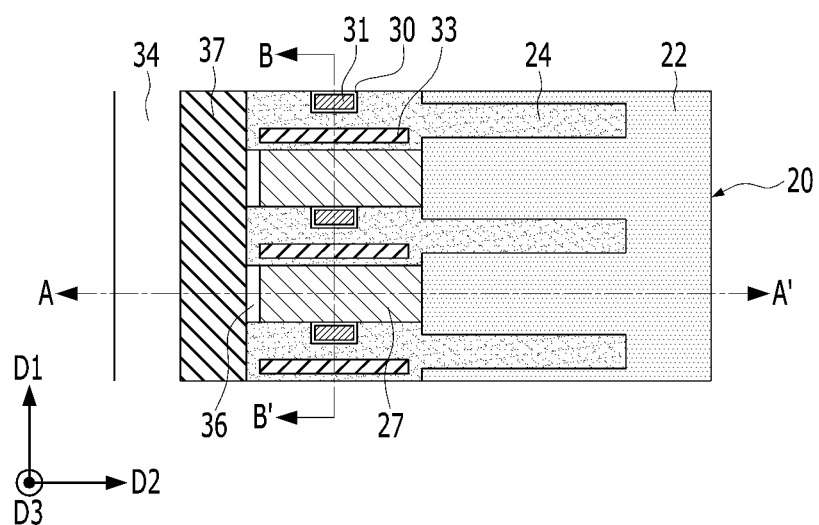
Figure 16B:
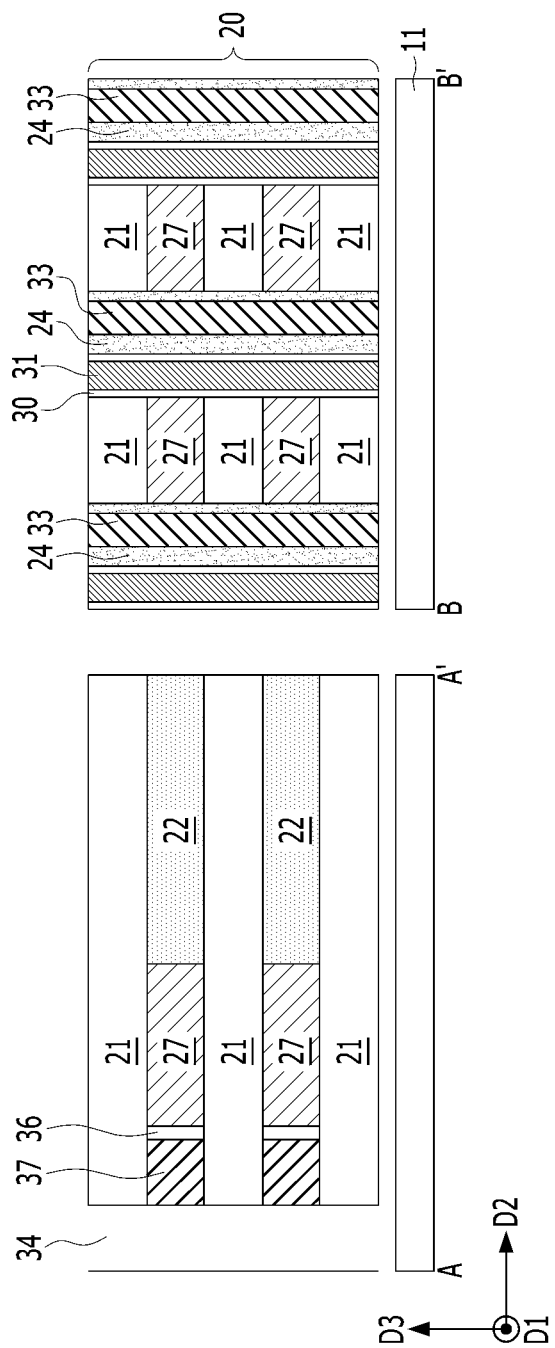

As shown in FIGS. 16A and 16B, a first source/drain 36 may be formed in each of the first ends of the semiconductor layers 27 exposed to the bit line recess 35. The first source/drain 36 may be so formed by ion implantation of impurities. The first source/drain 36 may be formed by plasma doping. The first source/drain 36 may include an N-type impurity or a P-type impurity. The first source/drain 36 may include phosphorus, arsenic, antimony, boron, or indium.

Next, bit lines 37 may be formed to fill corresponding bit is line recesses 35. The bit lines 37 may be commonly connected to the first sources/drains 36. The bit lines 37 may include a metal-based material. The bit lines 37 may include titanium nitride, tungsten, titanium silicide, or a combination thereof. The bit lines 37 may be extended laterally along the first direction D1. The neighboring bit lines 37 may be vertically arranged along the third direction D3.

Figure 17A:
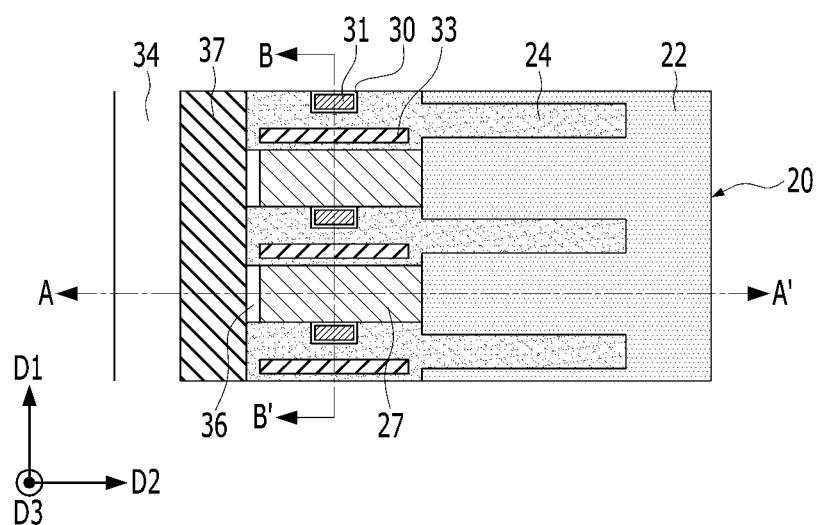
Figure 17B:
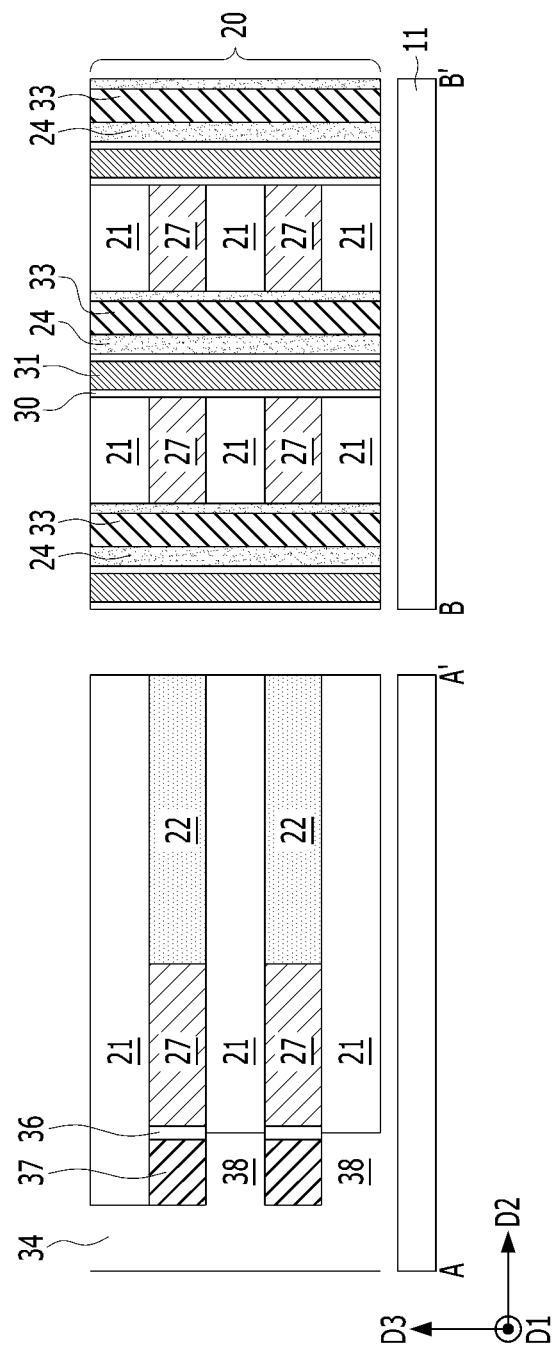

As shown in FIGS. 17A and 17B, line-shape recesses 38 may be formed below corresponding bit lines 37. The line-shape recesses 38 may be extended along the first direction D1. In order to form the line-shape recesses 38, some of the insulating layers 21 may be removed. The bit lines 37 and the line-shape recesses 38 may alternate along the third direction D3.

Figure 18A:
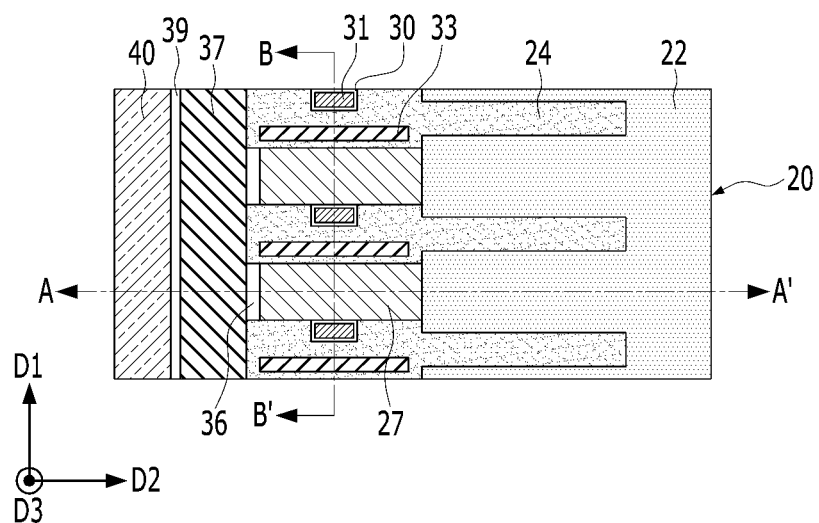
Figure 18B:
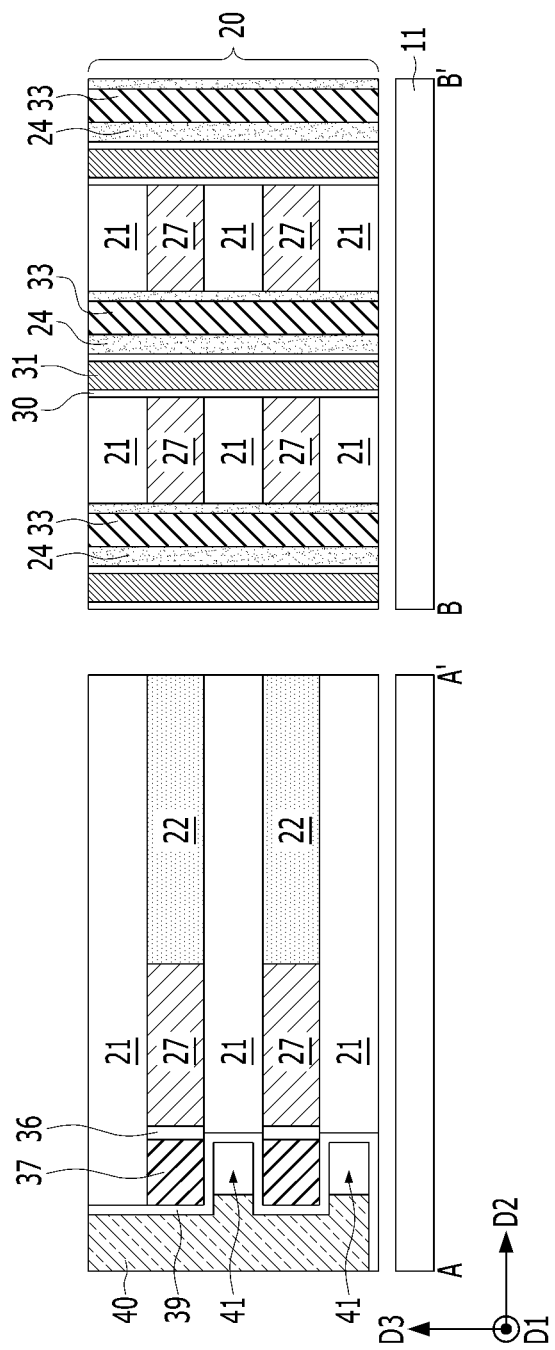

As shown in FIGS. 18A and 18B, line-shape air gaps 41 may be formed below corresponding bit lines 37. The line-shape air gaps 41 may be extended along the first direction D1. In order to form the line-shape air gaps 41, a capping layer 40 may be formed on the line-shape recesses 38. When the capping layer 40 is formed, the line-shape recesses 38 may be partially filled, and the line-shape air gaps 41 may be defined accordingly. The bit lines 37 and the line-shape air so gaps 41 may alternate along the third direction D3.

Before the capping layer 40 is formed, the liner capping layer 39 may be conformally formed. A liner capping layer 39 may be positioned between the line-shape air gaps 41 and the insulating layers 21. The bit lines 37 and the line-shape air gaps 41 may not directly contact each other because of the liner capping layer 39 being disposed between the two. The liner capping layer 39 may include silicon oxide, and the capping layer 40 may include silicon carbon oxide. The capping layer 40 may be formed by atomic layer deposition (ALD). In another embodiment, in order to form the capping layer 40, after defining the line-shape air gaps 41 by performing deposition and etchback of silicon carbon oxide, silicon oxide may be deposited. In this case, the line-shape air gaps 41 may be defined by silicon carbon oxide and the liner capping layer 39, and the third trench 34 may be filled with silicon oxide. The line-shape air gaps 41 may not expose the surfaces of the bit lines 37.

As described above, the line-shape air gaps 41 may be disposed below corresponding bit lines 37. The capping structure in which the line-shape air gaps 41 are embedded may include the liner capping layer 39, the capping layer 40, and the line-shape air gaps 41.

Parasitic capacitance between neighboring bit lines 37 may be reduced by the line-shape air gaps 41.

Figure 19A:
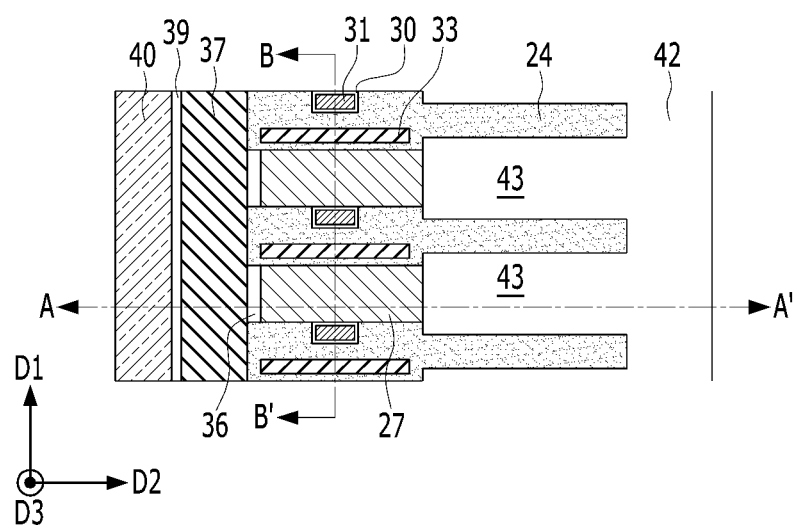
Figure 19B:
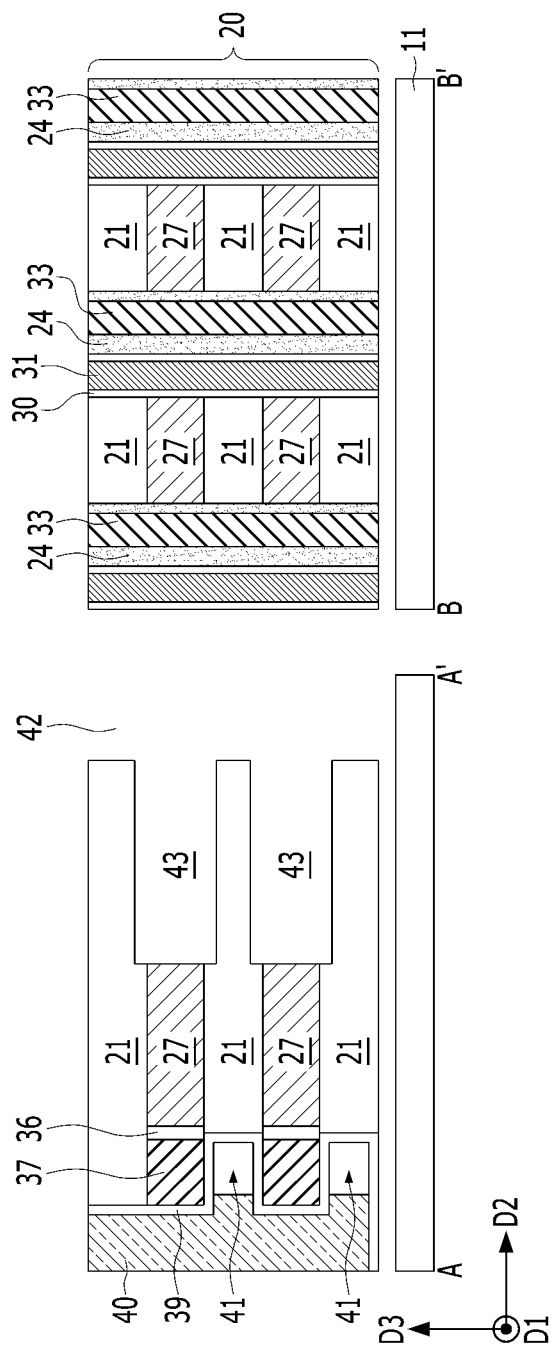

As shown in FIGS. 19A and 19B, a fourth trench 42 may be formed. The fourth trench 42 may be formed by etching the mold stack 20. The fourth trench 42 may be laterally extended along the first direction D1, and may be extended vertically along the third direction D3.

Next, the sacrificial layers 22 may be removed through the fourth trench 42 to form capacitor recesses 43 between the insulating layers 21. The capacitor recesses 43 may provide a space in which a subsequent storage node is to be formed. Partial etching of the insulating layers 21 and the isolation layer 24 may be additionally performed, so that the size of the capacitor recesses 43 may be increased.

Second ends of the semiconductor layers 27 may be exposed by the capacitor recesses 43.

Figure 20A:
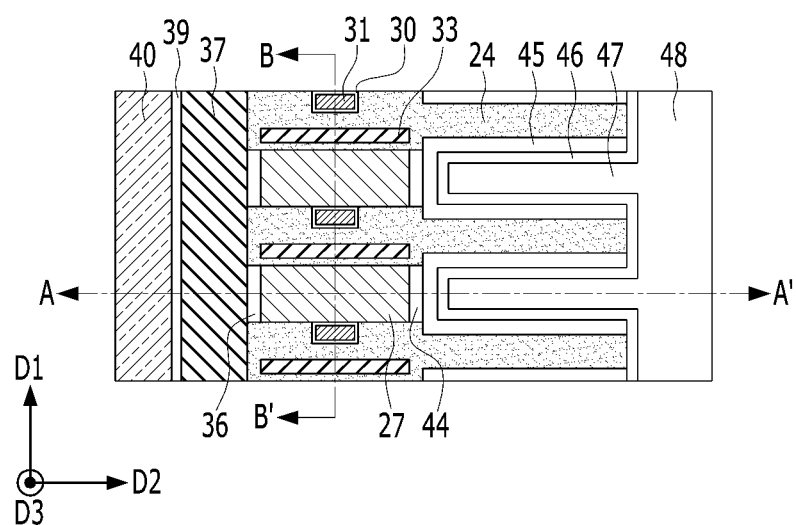
Figure 20B:
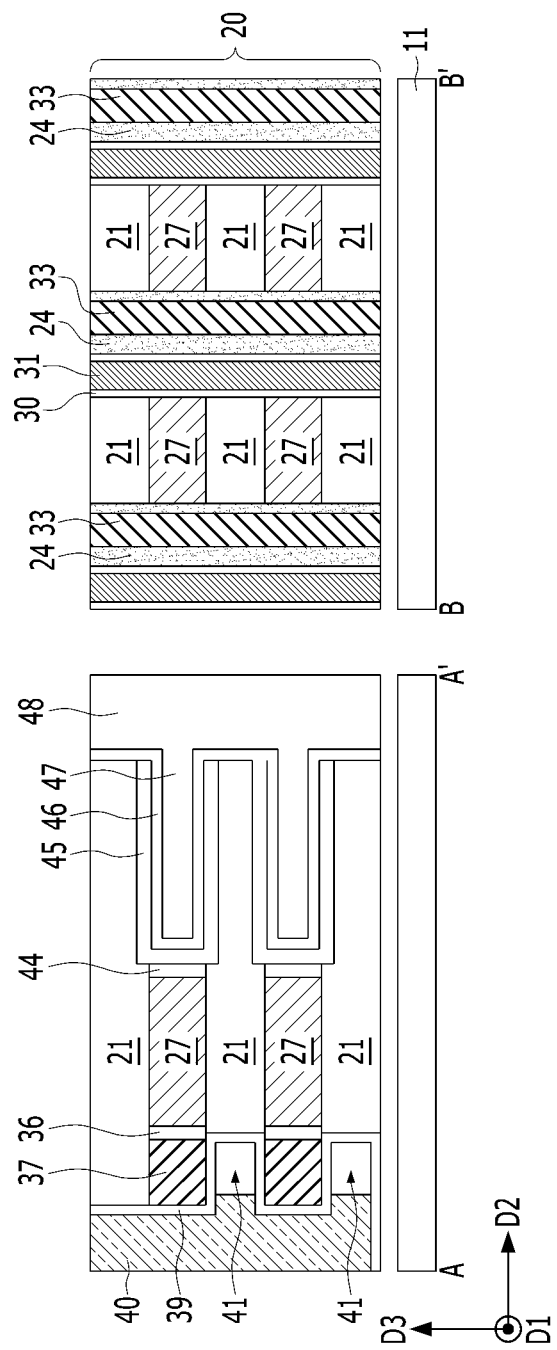

As shown in FIGS. 20A and 20B, a second source/drain 44 may be formed in each of the second ends of the semiconductor layers 27 exposed by the capacitor recesses 43, respectively. The second source/drain 44 may be formed by ion implantation of impurities. The second source/drain 44 may be formed by plasma doping. The second source/drain 44 may include an N-type impurity or a P-type impurity. The second source/drain 44 may include phosphorus, arsenic, antimony, boron, or indium.

Next, a storage node 45 of a capacitor may be formed, the storage node 45 being connected to the second sources/drains 44. The storage node 45 may be formed inside the capacitor recesses 43. The storage nodes 45 may have a cylinder shape. The storage nodes 45 may be connected to the second sources/drains 44, respectively. The storage nodes 45 may include a metal-based material. The storage nodes 45 may include titanium nitride, tungsten, titanium silicide, or a combination thereof. For example, in order to form the storage nodes 45, an etch-back process may be performed after depositing titanium nitride and a sacrificial oxide, and then the sacrificial oxide may be removed. The storage nodes 45 may have a cylinder shape extending laterally along the second direction D2. The storage nodes 45 adjacent to each other along the first and third directions D1 and D3 may be spaced apart from each other by the isolation layer 24 and the insulating layers 21.

Next, a dielectric layer 46 and a plate node 47 may be sequentially formed on the storage nodes 45.

The capacitor may include a storage node 45, a dielectric layer 46 and a plate node 47.

The dielectric layer 46 may be conformally formed on the storage nodes 45. The plate node 47 may be formed on the dielectric layer 46. The plate node 47 may fill the capacitor recesses 44 on the dielectric layer 46. Neighboring plate nodes 47 may be interconnected. For example, some of the plate nodes 47 may serve as the plate line 48, and the plate nodes 47 may be interconnected with each other through the plate line 48.

Figure 21A:
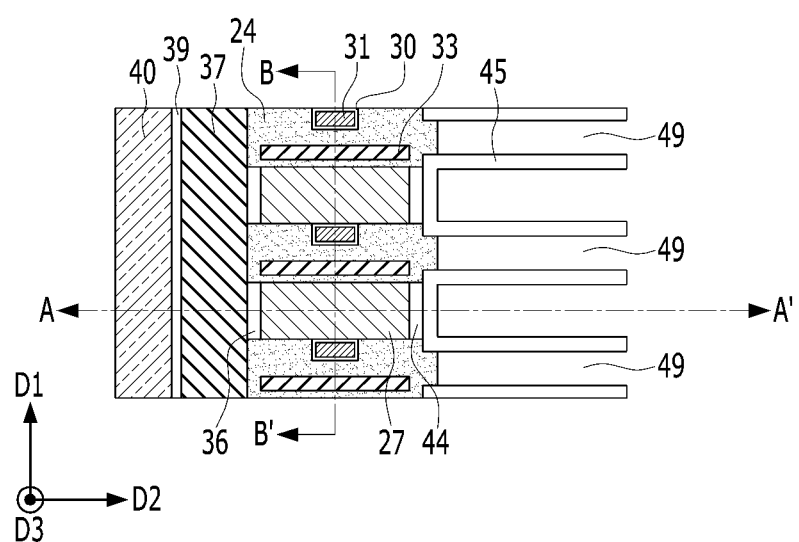
FIGS. 21A to 22B are diagrams illustrating another method for fabricating a semiconductor device according to an embodiment of the present invention.

FIGS. 21A to 22B are diagrams illustrating a method for fabricating a semiconductor device according to another embodiment. In FIGS. 21A and 21B, the same reference numerals as in FIGS. 3A to 20B denote the same components. Hereinafter, detailed descriptions of redundant components may be omitted.

First, the fourth trench 42 and the capacitor recesses 43 may be formed by a series of processes as shown in FIGS. 3A to 19B.

Figure 21B:
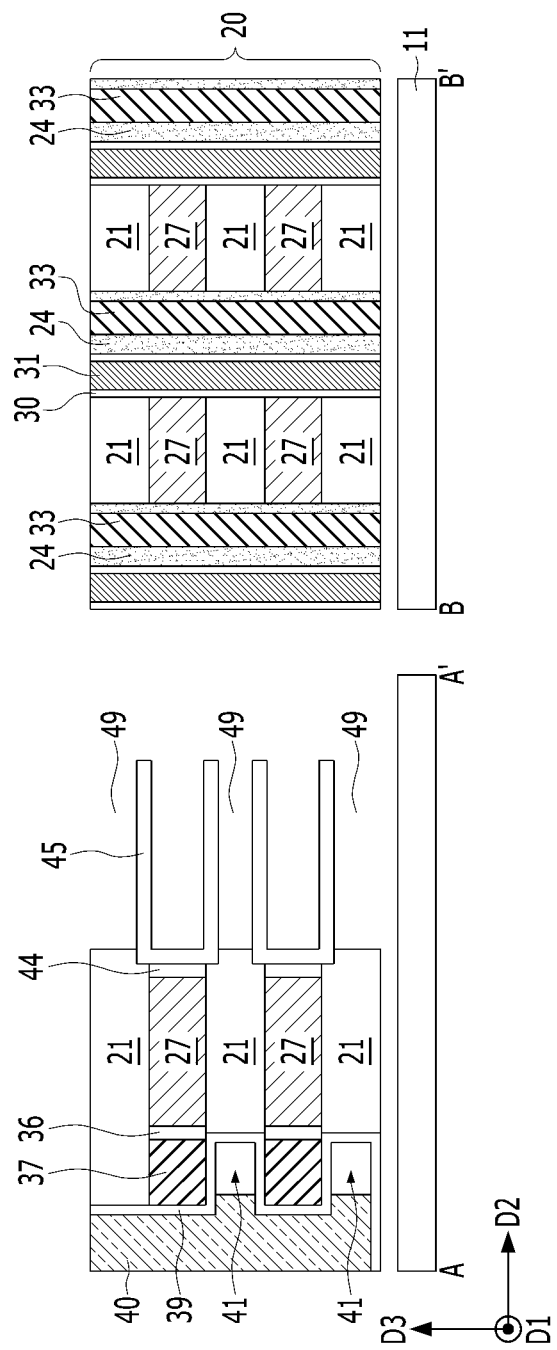

As shown in FIGS. 21A and 21B, the second sources/drain 44 may be formed in the second ends of the semiconductor layers 27 exposed by the capacitor recesses 43, respectively.

Next, the storage nodes 45 may be formed in corresponding capacitor recesses 43. For example, in order to form the storage nodes 45, an etch-back process may be performed after depositing titanium nitride and a sacrificial oxide, and then the sacrificial oxide may be removed. The storage nodes 45 may have a cylinder shape extending laterally along the second direction D2. The storage nodes 45 adjacent to each other along the first and third directions D1 and D3 may be spaced apart from each other by the isolation layer 24 and the insulating layers 21.

Next, some of the insulating layers 21 may be selectively removed. Accordingly, a space 49 in which outer walls of the storage nodes 45 are exposed may be formed. Both inner and outer walls of the storage nodes 45 may be exposed.

Figure 22A:
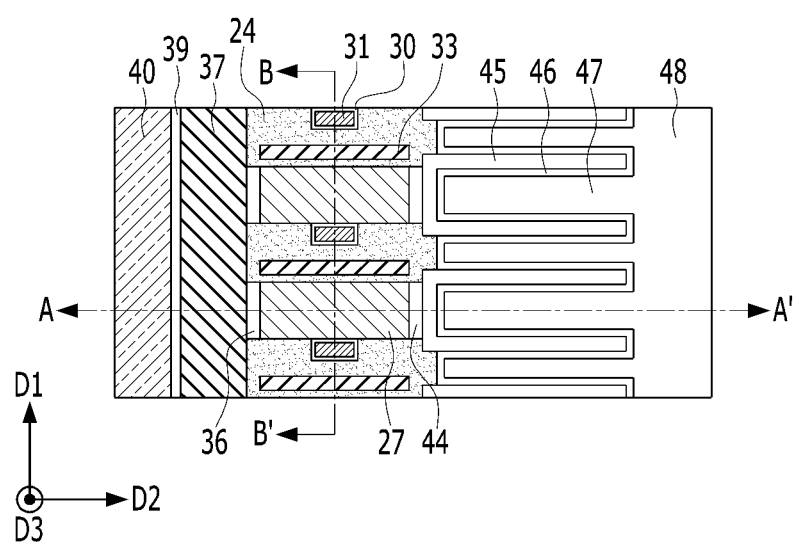
Figure 22B:
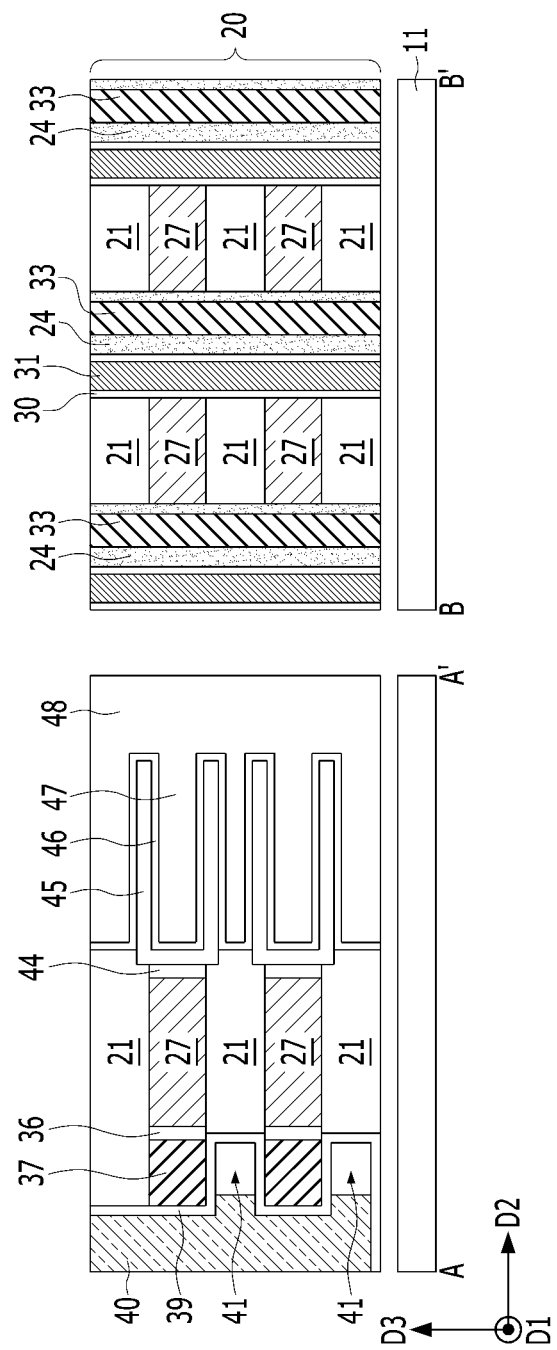

As shown in FIGS. 22A and 22B, a dielectric layer 46 may be formed conformally on the storage nodes 45. A plate node 47 may be formed on the dielectric layer 46.

Figure 23A:
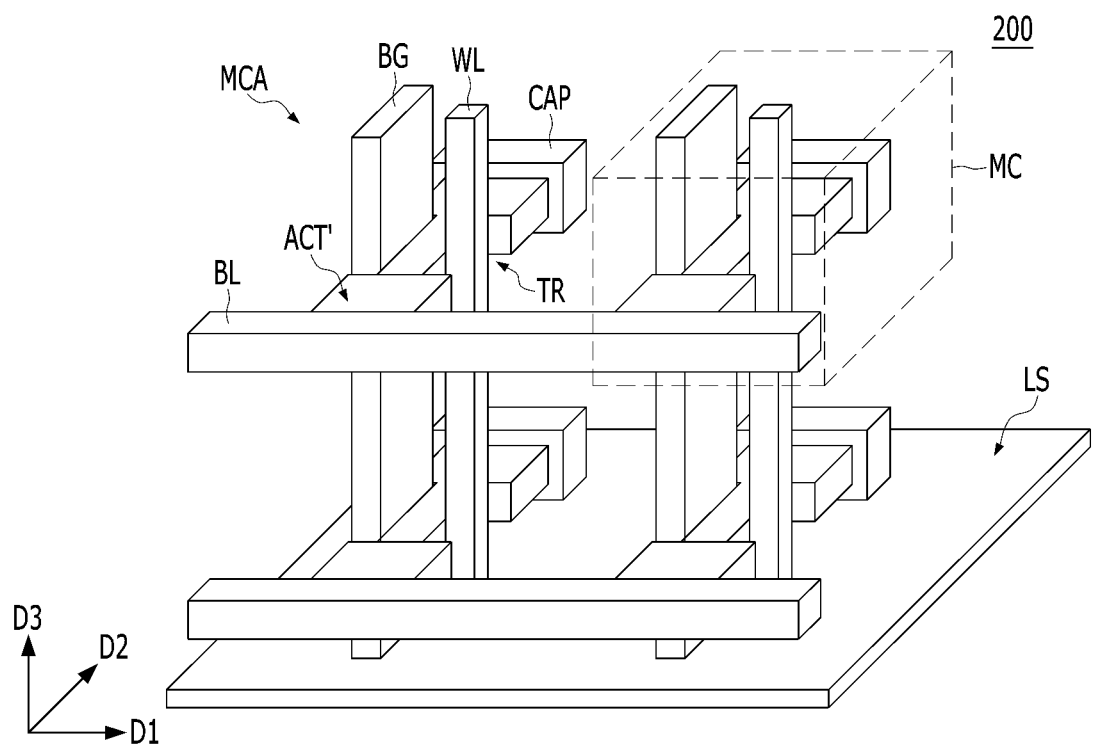
FIGS. 23A and 23B are a perspective view and a layout diagram, respectively, illustrating a semiconductor device according to another embodiment of the present invention.
Figure 23B:
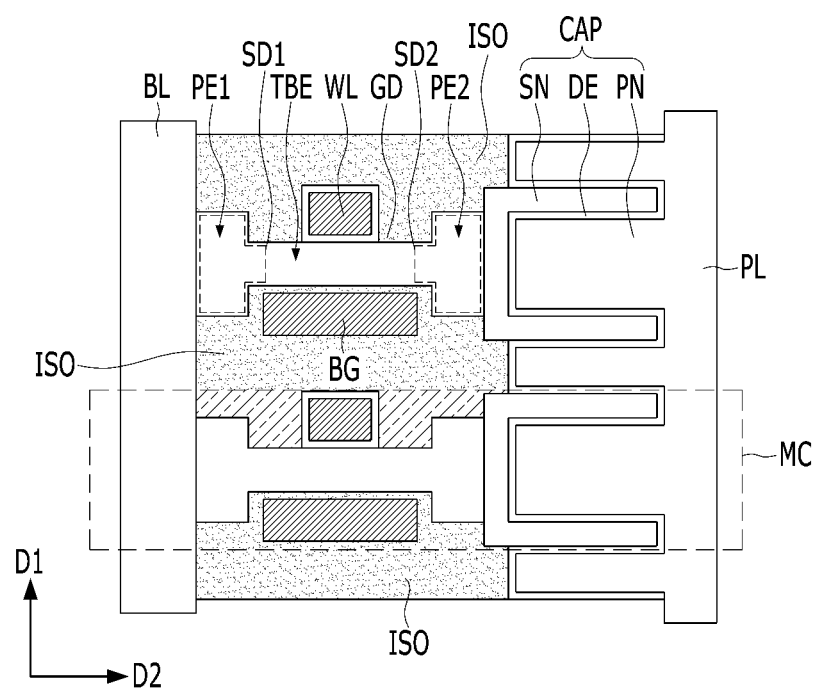

FIGS. 23A and 23B are a perspective view and a layout diagram, respectively, illustrating a semiconductor device according to another embodiment of the present invention.

In FIGS. 23A and 23B, the same reference numerals as in FIGS. 1 to 2B denote the same components. The semiconductor device 200 may be similar to the semiconductor device 100 of FIGS. 1 to 2B. Hereinafter, detailed descriptions of redundant components may be omitted.

Referring to FIGS. 23A and 23B, the semiconductor device 200 may include a plurality of memory cells MC. Each of the memory cells MC may include the transistor TR including the bit line BL, the word line WL, and the active layer ACT', and the capacitor CAP. The bit line BL may be extended laterally along the first direction D1. The word line WL and the back gate BG may be vertically oriented along the third direction D3. The transistor TR may include the active layer ACT' laterally oriented along the second direction D2. The isolation layer ISO may be disposed between the neighboring memory cells MC along the first direction D1.

The active layer ACT' may include a center body TBE and edge bodies PE1 and PE2 on both sides of the center body TBE. The center body TBE may be a thin body that is thinner than the edge bodies PE1 and PE2 as measured in the first direction D1. Thicknesses (or heights) of the center body TBE and the edge bodies PE1 and PE2 in the third direction D3 may be the same. The first and second sources/drains SD1 and SD2 may be formed in the edge bodies PE1 and PE2, respectively. The center body TBE may be referred to as a channel body, and a channel between the first source/drain SD1 and the second source/drain SD2 may be formed in the center body TBE. The center body TBE may have a thickness of about 10 nm or less (1 nm to 10 nm) in the first direction D1. The center body TBE may be referred to as a thin-body channel.

The word line WL and the back gate BG may face each other with the center body TBE interposed therebetween in the first direction D1. The gate insulating layer GD may be disposed between the center body TBE and the word line WL. The gate insulating layer GD may be disposed between the center body TBE and the back gate BG. The word line WL and the back gate BG may be extended vertically along the third direction D3. In respect to the thickness along the first direction D1, the thickness of the center body TBE may be thinner than that of the word line WL.

Figure 24A:
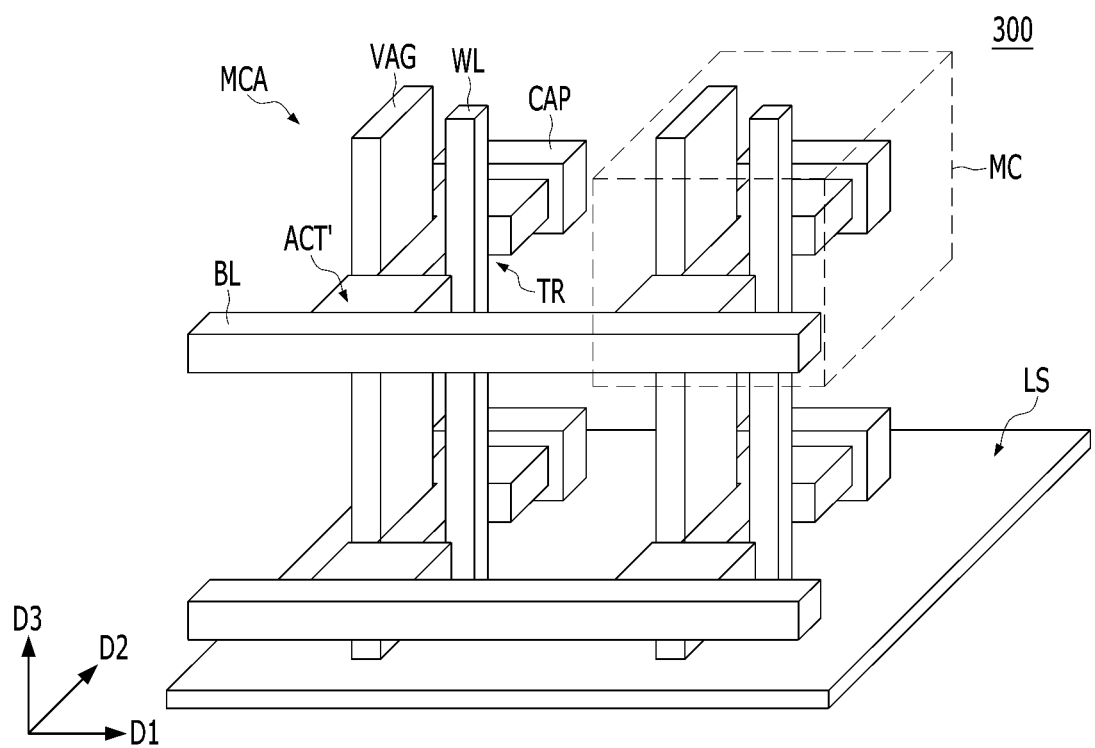
FIGS. 24A and 24B are a perspective view and a layout diagram, respectively, illustrating a semiconductor device according to another embodiment of the present invention.
Figure 24B:
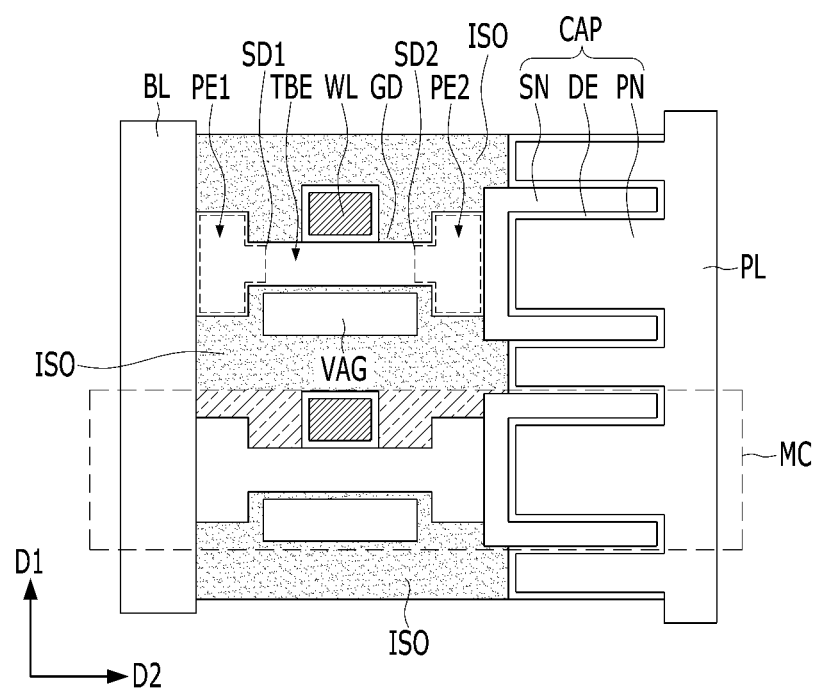

FIGS. 24A and 24B are a perspective view and a layout diagram, respectively, illustrating a semiconductor device according to another embodiment of the present invention.

In FIGS. 24A and 24B, the same reference numerals as in FIGS. 23A and 23B denote the same components. The semiconductor device 300 may be similar to the semiconductor device 200 of FIGS. 23A and 23B. Hereinafter, detailed descriptions of redundant components may be omitted.

Referring to FIGS. 24A and 24B, the semiconductor device 300 may include a plurality of memory cells MC. Each of the memory cells MC may include the transistor TR including the bit line BL, the word line WL, and the active layer ACT', and the capacitor CAP. The bit line BL may be extended laterally along the first direction D1. The word line WL may be vertically oriented along the third direction D3. The transistor TR may include the active layer ACT' laterally oriented along the second direction D2. The isolation layer ISO may be disposed between the neighboring memory cells MC along the first direction D1.

The active layer ACT' may include the center body TBE and edge bodies PE1 and PE2 on both sides of the center body TBE. The center body TBE is a thin body that is thinner than the edge bodies PE1 and PE2 as measured in the first direction D1. Thicknesses (or heights) of the center body TBE and the edge bodies PE1 and PE2 in the third direction D3 may be the same. First and second sources/drains SD1 and SD2 may be formed in the edge bodies PE1 and PE2, respectively. The center body TBE may be referred to as a channel body, and a channel between the first source/drain SD1 and the second source/drain SD2 may be formed in the center body TBE. The center body TBE may have a thickness of about 10 nm or less (1 nm to 10 nm) in the first direction D1. The center body TBE may be referred to as a thin-body channel.

The word line WL and a vertical air gap VAG may face each other with the center body TBE interposed therebetween. The gate insulating layer GD may be disposed between the center body TBE and the word line WL. The word line WL and the vertical air gap VAG may be extended vertically along the third direction D3. In the thickness along the first direction D1, the thickness of the center body TBE may be thinner than that of the word line WL. The vertical air gap VAG may be formed by substituting the back gate BG of FIGS. 23A and 23B with an air gap.

For example, without filling the back gate BG in the second through hole 32 as shown in FIGS. 12A and 12B, the second through hole 32 may be remained to form a vertical air gap VAG.

In FIGS. 23A to 24B, the center body TBE may be referred to as a nano wire channel. Meanwhile, the active layer ACT of FIGS. 1 to 2B may be referred to as a nano sheet.

Figure 25A:
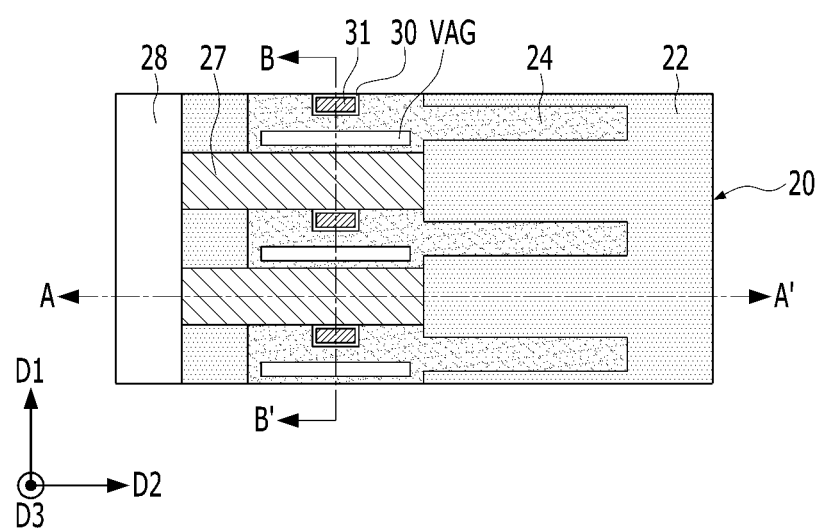
FIGS. 25A and 25B are diagrams illustrating a method for fabricating a vertical air gap.
Figure 25B:
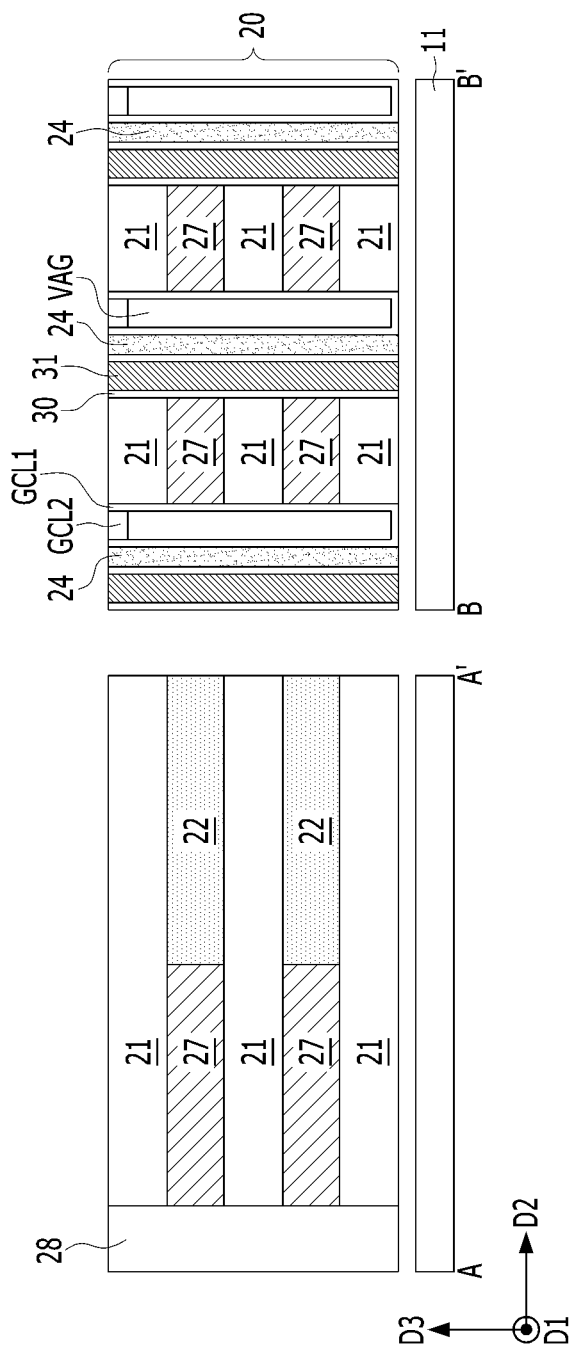

FIGS. 25A and 25B are diagrams illustrating a method for fabricating a vertical air gap VAG.

The second through hole 32 may be formed by a series of processes shown in FIGS. 3A to 12B.

Next, as shown in FIGS. 25A and 25B, a first gap capping layer GCL1 may be formed on the second through hole 32. Spin-on-carbon (SOC) deposition and etch-back may be performed to form the first gap capping layer GCL1. The first gap capping layer GCL1 may not fill the second through hole 32 and may conformally cover a bottom surface and a sidewall of the second through hole 32.

Next, a second gap capping layer GCL2 may be formed on the first gap capping layer GCL1. The second gap capping layer GCL2 may be subsequently planarized. The second gap capping layer GCL2 may be formed of a material having poor step coverage. For example, the second gap capping layer GCL2 may be formed of Ultra Low Temperature oxide (ULTO). The second gap capping layer GCL2 may not fill the second through hole 32 on the first gap capping layer GCL1.

As described above, the vertical air gap VAG may be defined by the second gap capping layer GCL2, and an upper region of the vertical air gap VAG may be sealed by the second gap capping layer GCL2.

In the above-described embodiments, the cell density can be improved because the memory cells are vertically stacked.

Embodiments may reduce parasitic capacitance between bit lines by line-type air gaps.

Embodiments may block interference between neighboring word lines by a back gate or a vertical air gap.

The above-described invention is not limited by the above-described embodiments and the accompanying drawings. It will readily be appreciated by one of ordinary skill in the art that various substitutions, changes, or modifications may be made thereto without departing from the scope of the disclosure.

What is claimed is:

1. A semiconductor device, comprising:
   a plurality of active layers vertically stacked over a substrate;
   a plurality of bit lines connected to first ends of the active layers, respectively, and extended parallel to the substrate;
   line-shape air gaps disposed between the bit lines;
   a plurality of capacitors connected to second ends of the active layers, respectively;
   a word line and a vertical shape air gap facing each other with the active layers interposed therebetween, the word line and the vertical shape air gap are vertically oriented from the substrate; and
   a gap capping layer capping an upper surface of the vertical shape air gap.

2. The semiconductor device of claim 1, wherein the active layers include polysilicon.

3. The semiconductor device of claim 1,
   wherein the bit lines and the line-shape air gaps alternate in a direction vertical to an upper surface of the substrate.

4. The semiconductor device of claim 1, wherein each of the active layers comprises:
   a channel body disposed between the word line and the vertical shape air gap; and
   source/drains on both sides of the channel body,
   wherein a thickness of the channel body is smaller than thicknesses of the source/drains.

5. The semiconductor device of claim 4, wherein the channel body of each of the active layers has a thickness smaller than the word line.

6. The semiconductor device of claim 4, wherein the channel body of each of the active layers has a thickness of 1 nm to 10 nm.

7. The semiconductor device of claim 1, further comprising an isolation layer between the active layers, and
   wherein the isolation layer is vertically extended from the substrate.

8. The semiconductor device of claim 7, wherein the word line and the vertical shape air gap penetrate through the isolation layer and vertically extend from the substrate.

9. A method for fabricating a semiconductor device, the method comprising:

forming a mold stack in which insulating layers and sacrificial layers alternate over a substrate;

forming a plurality of isolation layers penetrating through the mold stack;

substituting some of the sacrificial layers between the isolation layers with semiconductor layers;

forming a vertical shape word line and a vertical shape back gate, both vertically penetrating through the isolation layers and facing each other with the semiconductor layers interposed therebetween;

forming bit lines connected to first ends of the semiconductor layers, respectively, and extended parallel to the substrate; and forming laterally oriented capacitors connected to second ends of the semiconductor layers, respectively.

* * * * *